(12) United States Patent
Bimanand et al.

(10) Patent No.: US 10,442,549 B2
(45) Date of Patent: Oct. 15, 2019

(54) LINER-TYPE, ANTISTATIC TOPCOAT SYSTEM FOR AIRCRAFT CANOPIES AND WINDSHIELDS

(71) Applicant: PPG INDUSTRIES OHIO, INC., Cleveland, OH (US)

(72) Inventors: Alexander Bimanand, Burbank, CA (US); Krishna K. Uprety, Valencia, CA (US); Khushroo H. Lakdawala, Santa Clarita, CA (US)

(73) Assignee: PPG INDUSTRIES OHIO, INC., Cleveland, OH (US)

( * ) Notice: Subject to any disclaimer, the term of this patent is extended or adjusted under 35 U.S.C. 154(b) by 870 days.

(21) Appl. No.: 14/677,849

(22) Filed: Apr. 2, 2015

(65) Prior Publication Data

US 2016/0376025 A1    Dec. 29, 2016

(51) Int. Cl.
*B32B 7/02*     (2006.01)
*B32B 27/08*    (2006.01)
(Continued)

(52) U.S. Cl.
CPC .............. *B64D 45/02* (2013.01); *B05D 1/30* (2013.01); *B05D 3/101* (2013.01); *B05D 3/12* (2013.01); *B32B 27/40* (2013.01); *B64C 1/1476* (2013.01); *B64C 1/1484* (2013.01); *C03C 17/38* (2013.01); *C08J 7/045* (2013.01); *C09D 5/002* (2013.01);
(Continued)

(58) Field of Classification Search
CPC ...... H05K 9/0079; C09D 5/24; C09D 127/12; C09D 159/00; C09D 167/02; C09D 175/04

See application file for complete search history.

(56) References Cited

U.S. PATENT DOCUMENTS 3,017,386 A    1/1962  Brown, Jr. et al.
3,169,945 A    2/1965  Young et al.
(Continued)

FOREIGN PATENT DOCUMENTS

EP    2128528 A2   12/2009
EP    2228414 A1    9/2010
(Continued)

OTHER PUBLICATIONS

PCT Search Report and Written Opinion issued in Application No. PCT/US2015/054046, dated Dec. 22, 2015; 15 pages.
(Continued)

*Primary Examiner* — Hoa (Holly) Le
(74) *Attorney, Agent, or Firm* — Lewis Roca Rothgerber Christie LLP

(57) ABSTRACT

A coated substrate includes: a substrate; an electrically conductive multilayer stack on the substrate; and a coating on the electrically conductive multilayer stack. A thickness of the coating is 5 to 10 mils and the coating includes a conductive, anti-static tiecoat on the electrically conductive multilayer stack; and a conductive, anti-static topcoat on the conductive, anti-static tiecoat. The conductive, anti-static tiecoat and the conductive, anti-static topcoat are formed from a coating composition including a hydrophobic first aliphatic polyisocyanate, a second aliphatic polyisocyanate including a hydrophilic portion, a polyester polyol, a hydrophilic polyol, and a fluorinated polyol compound is disclosed.

20 Claims, 6 Drawing Sheets

(51) Int. Cl.

| | | |
|---|---|---|
| B64D 45/02 | (2006.01) | |
| B32B 27/40 | (2006.01) | |
| B64C 1/14 | (2006.01) | |
| C03C 17/38 | (2006.01) | |
| C08J 7/04 | (2006.01) | |
| G02B 1/111 | (2015.01) | |
| G02B 1/116 | (2015.01) | |
| B05D 1/30 | (2006.01) | |
| B05D 3/10 | (2006.01) | |
| B05D 3/12 | (2006.01) | |
| C09D 5/00 | (2006.01) | |
| C09D 5/24 | (2006.01) | |
| C09D 183/04 | (2006.01) | |
| C23C 14/08 | (2006.01) | |
| C23C 14/20 | (2006.01) | |
| G02B 1/16 | (2015.01) | |
| C23C 14/35 | (2006.01) | |

(52) U.S. Cl.
CPC ............. *C09D 5/24* (2013.01); *C09D 183/04* (2013.01); *C23C 14/08* (2013.01); *C23C 14/083* (2013.01); *C23C 14/20* (2013.01); *G02B 1/111* (2013.01); *G02B 1/116* (2013.01); *G02B 1/16* (2015.01); *C08J 2369/00* (2013.01); *C08J 2475/04* (2013.01); *C23C 14/35* (2013.01)

(56) References Cited

U.S. PATENT DOCUMENTS

| | | | |
|---|---|---|---|
| 3,180,781 A | 4/1965 | Ryan et al. | |
| 3,995,089 A | 11/1976 | Hartmann et al. | |
| 4,173,682 A | 11/1979 | Noomen et al. | |
| 4,234,664 A | 11/1980 | Hendy | |
| 4,442,259 A | 4/1984 | Isgur et al. | |
| 4,465,736 A | 8/1984 | Nishihara et al. | |
| 4,642,263 A | 2/1987 | Culbertson | |
| 5,084,132 A | 1/1992 | Smith | |
| 5,213,828 A | 5/1993 | Winter et al. | |
| 5,378,535 A | 1/1995 | Moncur et al. | |
| 5,472,785 A | 12/1995 | Stobbie, IV et al. | |
| 5,780,160 A | 7/1998 | Allemand et al. | |
| 5,859,722 A | 1/1999 | Suga et al. | |
| 5,939,188 A | 8/1999 | Moncur et al. | |
| 5,982,606 A | 11/1999 | Masuda et al. | |
| 6,213,602 B1 | 4/2001 | Smarto | |
| 6,395,821 B1 | 5/2002 | Shimada et al. | |
| 6,417,292 B1 | 7/2002 | Moriarity et al. | |
| 6,426,125 B1 | 7/2002 | Yang et al. | |
| 6,690,564 B1 | 2/2004 | Haruta et al. | |
| 6,706,801 B1 | 3/2004 | Blum et al. | |
| 6,737,121 B2 | 5/2004 | Yang et al. | |
| 6,933,053 B2 | 8/2005 | Alger | |
| 7,093,307 B1 | 8/2006 | Smith | |
| 7,626,749 B2 | 12/2009 | Baur et al. | |
| 7,636,188 B2 | 12/2009 | Baur et al. | |
| 7,859,738 B2 | 12/2010 | Baur et al. | |
| 7,863,375 B2 | 1/2011 | Baghdachi et al. | |
| 7,923,113 B2 | 4/2011 | Dogan et al. | |
| 8,956,730 B2 | 2/2015 | Uprety et al. | |
| 9,546,300 B2 * | 1/2017 | Bimanand ................. B64D 7/00 | |
| 2002/0110695 A1 | 8/2002 | Yang et al. | |
| 2003/0054172 A1 | 3/2003 | Savu et al. | |
| 2004/0192835 A1 | 9/2004 | Steidl et al. | |
| 2006/0051592 A1 | 3/2006 | Rawlings et al. | |
| 2006/0052509 A1 | 3/2006 | Saitoh | |
| 2006/0134501 A1 | 6/2006 | Lee et al. | |
| 2006/0274047 A1 | 12/2006 | Spath et al. | |
| 2007/0002421 A1 | 1/2007 | Rukavina et al. | |
| 2007/0021553 A1 | 1/2007 | Lichte et al. | |
| 2007/0029299 A1 | 2/2007 | Prone et al. | |
| 2007/0224340 A1 | 9/2007 | Hatta et al. | |
| 2007/0249088 A1 | 10/2007 | Ohmori et al. | |
| 2008/0073622 A1 | 3/2008 | Housel | |
| 2008/0113200 A1 | 5/2008 | Peng et al. | |
| 2008/0152870 A1 | 6/2008 | Takada et al. | |
| 2008/0176973 A1 | 7/2008 | Qiu et al. | |
| 2008/0212189 A1 | 9/2008 | Baur et al. | |
| 2009/0040306 A1 | 2/2009 | Foote et al. | |
| 2009/0074973 A1 * | 3/2009 | Graham ............... H05K 9/0067 427/331 |
| 2009/0080055 A1 | 3/2009 | Baur et al. | |
| 2009/0169870 A1 | 7/2009 | Zheng | |
| 2009/0289235 A1 | 11/2009 | Kniajanski et al. | |
| 2009/0301461 A1 | 12/2009 | Taplan et al. | |
| 2010/0025533 A1 | 2/2010 | Bimanand et al. | |
| 2010/0028684 A1 * | 2/2010 | Mariscal ............... B64C 1/1476 428/413 |
| 2010/0065788 A1 | 3/2010 | Momose et al. | |
| 2010/0066519 A1 | 3/2010 | Baur et al. | |
| 2010/0156842 A1 | 6/2010 | Cherif | |
| 2010/0261002 A1 | 10/2010 | Tajima et al. | |
| 2011/0083886 A1 | 4/2011 | Kim | |
| 2011/0147715 A1 | 6/2011 | Rogers et al. | |
| 2011/0217455 A1 | 9/2011 | Veerasamy | |
| 2012/0015098 A1 | 1/2012 | Cheng et al. | |
| 2012/0112133 A1 | 5/2012 | Bahnmüller et al. | |
| 2012/0138589 A1 | 6/2012 | Mitchell et al. | |
| 2012/0328859 A1 | 12/2012 | Uprety et al. | |
| 2014/0093696 A1 * | 4/2014 | Uprety ..................... B64D 7/00 428/172 |
| 2014/0093738 A1 * | 4/2014 | Bimanand ................ B64D 7/00 428/425.9 |
| 2015/0264845 A1 * | 9/2015 | Bimanand ............ H05K 9/0079 428/334 |

FOREIGN PATENT DOCUMENTS

| | | |
|---|---|---|
| WO | WO 98/44015 | 10/1998 |
| WO | WO 00/55389 | 9/2000 |
| WO | WO 2006/000763 A2 | 1/2006 |
| WO | WO 2006/124682 A2 | 11/2006 |
| WO | WO 2007/040352 A1 | 4/2007 |
| WO | WO 2008/068042 A2 | 6/2008 |
| WO | WO 2010/102760 A1 | 9/2010 |
| WO | WO 2010/132858 A2 | 11/2010 |
| WO | WO 2012/138693 A2 | 10/2012 |
| WO | WO 2014/051869 A1 | 4/2014 |
| WO | WO 2014/143389 A1 | 9/2014 |

OTHER PUBLICATIONS

International Preliminary Report on Patentability Chapter I issued in corresponding International Application No. PCT/US2015/054046, dated Oct. 12, 2017, 9 pages.

Berredjem, et al., "On the improvement of the efficiency of organic photovoltaic cells by the presence of an ultra-thin metal layer at the interface organic/ITO," The European Physical Journal Applied Physics, Oct. 24, 2008, vol. 44, pp. 223-228.

Cairns, et al., "Strain-dependent electrical resistance of tin-doped indium oxide on polymer substrates," Applied Physics Letters, Mar. 13, 2000, vol. 76, No. 11, pp. 1425-1427.

Fortunato, et al., "Influence of the Strain on the Electrical Resistance of Zinc Oxide Doped Thin Film Deposited on Plymer Substrates," Advanced Engineering Materials, May 1, 2002, vol. 4, No. 8, pp. 610-612.

Lansaker, et al., "$TiO_2$/Au/$TiO_2$ multilayer thin films: Novel metal-based transparent conductors for electrochromic devices," Thin Solid Films, 2009, vol. 518, pp. 1225-1229.

Meng, et al.; Carbon Nanotube Composite Films With Switchable Transparency; ACS Applied Materials & Interfaces; vol. 3; pp. 658-661; 2011; 4 Pages.

Nanowerk; Stretchy and conductive nanotechnology composite for robot skin and strain sensors; Source: http://www.nanowerk.com/spotlight/spotid=16373.php; Date Accessed: Sep. 6, 2013; Webpage.

Sibinski, et al.; Carbon nanotube transparent conductive layers for solar cells applications; Optica Applicata; vol. 41, No. 2; pp. 375-381; 2011; 7 pages.

(56) References Cited

OTHER PUBLICATIONS

Sibinski, et al.; Flexible Solar Cells with Carbon Nanotubes; SPIE Newsroom: SPIE; Sensing & Measurement; Source: http://spie.org/x57669.xml?pf=true&ArticleID=x57669; Nov. 17, 2011; 2 pages.

Shin, et al.; Elastomeric Conductive Composites Based on Carbon Nanotube Forests; Advanced Materials; vol. 22(24); pp. 2663-2667; 2010; 5 Pages.

Xia, et al.; Preparation and characterisation of polyurethane grafted single-walled carbon nanotubes and derived polyurethane nanocomposites; Journal of Material Chemistry; vol. 16; pp. 1843-1851; 2006.

Zhang, et al.; "A Facile Synthesis of Polypyrrole/Carbon Nanotube Composites with Ultrathin, Uniform and Thickness-Tunable Polypyrrole Shells"; Nanoscale Research Letters; Jun. 17, 2011; 9 Pages.

Zhao, et al.; "Effect of silica coating thickness on the thermal conductivity of polyurethane/$SiO_2$ coated multiwalled carbon nanotube composites"; Composites: Part A 58 (2014) 1-6; Elsevier Ltd.; Applied Science and Manufacturing; Nov. 21, 2013; 6 Pages.

* cited by examiner

LINER-TYPE, ANTISTATIC TOPCOAT SYSTEM FOR AIRCRAFT CANOPIES AND WINDSHIELDS

STATEMENT REGARDING POTENTIAL NATIONAL SECURITY CONCERN

This application contains subject matter that may be controlled under US International Traffic in Arms Regulations ("ITAR"), 22 CFR Para. 120-130. Therefore, this application should be considered by the appropriate federal agency for imposition of a secrecy order.

BACKGROUND

Polyurethane polymers can be used as a coating for a variety of applications. For example, they can be used as a coating for coated substrates, such as a coated transparency for an aircraft. Aircraft transparencies (e.g., canopies), and particularly stealth aircraft canopies, preferably include a low resistance (i.e., high electrical conductivity) layer (or layers) to prevent or reduce the buildup of static charge and to provide radar attenuation. Static charge can buildup on a canopy as the result of precipitation static and/or lightning strikes, and may interfere with various functions of the aircraft. By including a low resistance layer (or layers), an aircraft canopy can drain or dissipate static electricity and thereby prevent or reduce the buildup of static charge on the canopy. The low resistance layer (or layers) may be coated with a high resistance coating (e.g., a polyurethane antistatic topcoat), as long as static charge can be transferred through the organic topcoat into the low resistance layer (or layers).

Modern jet aircraft canopies, such as F-22 stealth fighter canopies, are typically made of polymeric materials. Such materials are desirable because of their light weight, high strength, and ease of shaping. Most polymeric materials, however, do not meet the requirements for stealth aircraft, such as low sheet resistance and the ability to withstand extreme weather conditions. As a result, coatings (e.g., organic and inorganic coatings) are employed to impart high electrical conductivity and other characteristics to the canopy.

SUMMARY

A coated substrate includes: a substrate; an electrically conductive multilayer stack on the substrate; and a coating on the electrically conductive multilayer stack, a thickness of the coating being 5 to 10 mils and the coating including: a conductive, anti-static tiecoat on the electrically conductive multilayer stack; and a conductive, anti-static topcoat on the conductive, anti-static tiecoat, a thickness of the coating being 5 to 10 mils, and the conductive, anti-static tiecoat being formed from a coating composition including a hydrophobic first aliphatic polyisocyanate, a second aliphatic polyisocyanate including a hydrophilic portion, a polyester polyol, a hydrophilic polyol, and a fluorinated polyol.

A thickness of each of the conductive, anti-static topcoat and the conductive, anti-static tiecoat may be 2.5 to 5 mils.

The thickness of the coating may be 5 to 8 mils.

A thickness of each of the conductive, anti-static topcoat and the conductive, anti-static tiecoat may be 2.5 to 4 mils.

The thickness of the coating may be 6 to 8 mils.

A thickness of each of the conductive, anti-static topcoat and the conductive, anti-static tiecoat may be 3 to 4 mils.

A thickness of the conductive, anti-static tiecoat may be at least 3 mils.

A thickness of the conductive, anti-static topcoat may be at least 3 mils.

The conductive, anti-static tiecoat may be substantially free of inherently conductive polymers, ionic liquids, conductive oxides and carbon nanotubes.

The conductive, anti-static topcoat may be substantially free of inherently conductive polymers, ionic liquids, conductive oxides and carbon nanotubes.

The coated substrate may further include a tiecoat between the substrate and the electrically conductive multilayer stack.

The coated substrate may further include a basecoat between the tiecoat and the electrically conductive multilayer stack.

The coated substrate may further include a primer layer between the electrically conductive multilayer stack and the conductive, anti-static tiecoat.

The coating may have a resilience such that the coating can be stretched to a length 50% or more longer than the as-formed length of the coating substantially without tearing the coating.

The coating may have a resilience such that the coating can be stretched to a length 100% or more longer than the as-formed length of the coating substantially without tearing the coating.

The coating may have a resilience such that the coating can be stretched to a length 200% or more longer than the as-formed length of the coating substantially without tearing the coating.

The second aliphatic polyisocyanate may further include a hydrophobic portion.

The hydrophobic portion of the second aliphatic polyisocyanate may include an isophorone diisocyanate moiety or a derivative thereof.

The hydrophilic portion of the second aliphatic polyisocyanate may include a polyether chain.

The second aliphatic polyisocyanate may include a polyether chain bonded to an isophorone diisocyanate trimer.

The hydrophobic first aliphatic polyisocyanate may have an isocyanate functionality in a range of 3.0 to 4.2.

The hydrophobic first aliphatic polyisocyanate may be selected from the group consisting of biuret-based polyisocyanates, isocyanurate ring-based polyisocyanates, and combinations thereof.

A weight ratio of the hydrophobic first aliphatic polyisocyanate to the second aliphatic polyisocyanate may be in a range of about 95:5 to about 85:15.

BRIEF DESCRIPTION OF THE DRAWINGS

These and other features of embodiments of the present disclosure will be better understood by reference to the following detailed description when considered in conjunction with the accompanying drawings, in which.

DETAILED DESCRIPTION

In the following description and in the claims, various layers are described as being "on," "over," or "positioned over" one or more additional layers. This language simply denotes the relative positions of the layers. Thus, in some embodiments, two layers are literally right next to each other, while in other embodiments, the same two layers are separated by one or more additional layer(s). In each case, one of the two layers is considered to be "on," "over," or positioned over" the other layer. Also, "on" or "over" can mean "below." For example, a layer that is "on" or "over" another layer can also be considered "below" the other layer, depending upon the point of view.

As used herein, the term "coated substrate" or "coated transparency" refers to a substrate or transparency that has been protected (e.g., coated) with one or more layer(s) on the substrate. The substrate or transparency can be made of glass or plastic, coated or uncoated, and can form a window or a windshield of a car, aircraft, boat, building, or any other suitable vehicle or structure.

Figure 1:
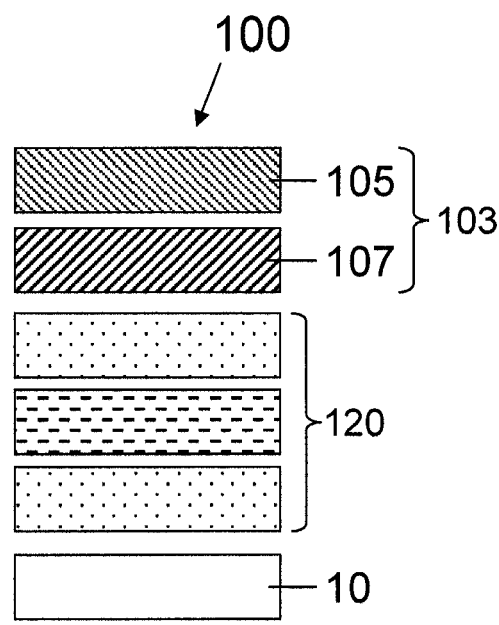
FIG. 1 is an exploded, cross-sectional view of an embodiment of a coated substrate including a conductive, anti-static tiecoat and a conductive, anti-static topcoat.

Aspects of embodiments of the present disclosure are directed toward a coating that is tough, durable and weather resistant, yet is still pliable and flexible. FIG. 1 is a cross-sectional view showing an embodiment of a coated substrate 100 including a substrate 10, an electrically conductive multilayer stack 120 on the substrate, and a coating 103 on the electrically conductive multilayer stack. The coating includes a conductive, anti-static tiecoat 107 on the electrically conductive multilayer stack, and a conductive, anti-static topcoat 105 on the conductive, anti-static tiecoat. In some embodiments, a thickness of the coating (e.g., a total thickness of the conductive, anti-static tiecoat and the conductive, anti-static topcoat) is 5 to 10 mils (127 to 254 μm). The coating may be a liner kind of coating. As used herein, the statement "liner kind of coating" refers to a coating having a thickness of at least 5 mils (e.g., a thickness of 5 to 10 mils) and a resilience such that the coating can be stretched to a length 50% or more longer than the as-formed length (the initial, unstretched length) of the coating substantially without breaking (e.g., substantially without tearing or cracking or without tearing or separating into two separate portions). In some embodiments, the coating can be stretched to a length 100% or more (e.g., 100% to 300%) longer than the as-formed length (the initial, unstretched length) of the coating substantially without breaking (e.g., substantially without tearing or cracking or without tearing or separating into two separate portions). In some embodiments, the coating can be stretched to a length 200% or more (e.g., 200% to 300%) longer than the as-formed length (the initial, unstretched length) of the coating substantially without breaking (e.g., substantially without tearing or cracking or without tearing or separating into two separate portions).

Embodiments of the conductive, anti-static tiecoat include a polyurethane and are highly resilient. The conductive, anti-static tiecoat functions as a shock absorber for impacts (e.g., high energy impacts) of rain droplets in a rain erosion test. Rain erosion resistance properties of embodiments of the coated substrate including the conductive, anti-static tiecoat are significantly enhanced as compared to coated substrates that do not include the conductive, anti-static tiecoat, but are otherwise the same. For example, a coated substrate that includes the substrate (e.g., an acrylic substrate), the electrically conductive multilayer stack on the substrate, and the conductive, anti-static topcoat on the electrically conductive multilayer stack, but does not include the conductive, anti-static tiecoat, shows significantly compromised performance in a rain erosion test at 550 mph and 575 mph. Further, a coating including a conductive, anti-static topcoat prepared utilizing a single flow coating does not have suitable rain erosion resistance (e.g., does not pass the rain erosion test at 550 mph and 575 mph) and/or cosmetics. As used herein, the term "single flow" refers to a coating formed utilizing a single application and curing of the coating. For example, a coating including the conductive, anti-static topcoat, but not the conductive, anti-static tiecoat, has not been prepared to be very thick (e.g., thicker than 5 or 6 mils), cosmetically acceptable conductive, and/or to have suitable rain erosion resistance utilizing a single flow coating due to the high viscosities of the coating composition for forming the conductive, anti-static topcoat. The coated substrate of embodiments of the present disclosure (e.g., the coating including the conductive, anti-static tiecoat and the conductive, anti-static topcoat) provides significantly improved rain erosion resistance properties as compared to coated substrates that include the conductive, anti-static topcoat, but do not include the conductive, anti-static tiecoat.

Embodiments of the coated substrate provide suitable rain erosion resistance (e.g., the coated substrate passes the rain erosion test at 550 mph and 575 mph) by way of a relatively thick and resilient conductive, anti-static tiecoat. By including both the conductive, anti-static tiecoat and the conductive, anti-static topcoat, the coating can be made to be at least 5 mils thick and to have a resilience such that the coating can be stretched to a length 50% or more longer than the as-formed length (the initial, unstretched length) of the coating substantially without breaking (e.g., substantially without tearing or cracking or without tearing or separating into two separate portions), and in some embodiments, the coating can be stretched to a length 100% or more (e.g., 100% to 300%) longer than the as-formed length (the initial, unstretched length) of the coating substantially without breaking (e.g., substantially without tearing or cracking or without tearing or separating into two separate portions). In some embodiments, the coating can be stretched to a length 200% or more (e.g., 200% to 300%) longer than the as-formed length (the initial, unstretched length) of the coating substantially without breaking (e.g., substantially without tearing or cracking or without tearing or separating into two separate portions). While the present disclosure is not limited by any particular mechanism or theory, it is believed that due to the resilience of embodiments of the coating including the conductive, anti-static tiecoat, prolonged exposure in QUV and humidity tests do not significantly degrade the adhesion and rain erosion resistance properties of the coated substrate.

The total thickness of the conductive, anti-static topcoat and the conductive, anti-static tiecoat together (the combined thickness of the conductive, anti-static topcoat and the conductive, anti-static tiecoat) may be at least 5 mils (127 µm), for example, 5 to 10 mils (127 to 254 µm), 6 to 10 mils (152.4 to 254 µm), 5 to 8 mils (127 to 203.2 µm), 5 to 7 mils (127 to 177.8 µm), or 6 to 8 mils (152.4 to 203.2 µm). When the coating has a thickness of at least 5 mils (the combined thickness of the conductive, anti-static topcoat and the conductive, anti-static tiecoat is at least 5 mils) the coating is expected to exhibit liner-type properties (or liner kind of properties) and good rain erosion performance at 575 mph. The conductive, anti-static topcoat and the conductive, anti-static tiecoat may each have a thickness of 2.5 to 5 mils (63.5 to 127 µm), 2.5 to 4 mils (63.5 to 101.6 µm), or 3 to 4 mils (76.2 to 101.6 µm). In some embodiments, the conductive, anti-static topcoat and the conductive, anti-static tiecoat each have a thickness of 2.56 to 2.76 mils (65 to 70 µm). In other embodiments, the conductive, anti-static topcoat and the conductive, anti-static tiecoat each have a thickness of at least 3 mils (e.g., at least 3 mils to 5 mils). In still other embodiments, the conductive, anti-static topcoat and the conductive, anti-static tiecoat each have a thickness of 4 mils (101.6 µm) to have a combined thickness of 8 mils (203.2 µm).

Embodiments of the conductive, anti-static tiecoat are thick, resilient, and enhance the performance of the coated substrate in the rain erosion test at 575 mph. When the coated substrate includes the thick (e.g., at least 5 mils) and resilient conductive, anti-static tiecoat and a thick and resilient conductive, anti-static topcoat on the electrically conductive multilayer stack on the substrate (e.g., a stretched acrylic substrate), the coated substrate exhibits good Bayer abrasion, QUV, steam, humidity, rain erosion, acid rain, salt-fog, and chemical/solvent test results along with good p-static charge dissipation capabilities. Embodiments of the conductive, anti-static tiecoat and the conductive, anti-static topcoat also have anti-static properties that allow the passage of static charge through the conductive, anti-static tiecoat and/or the conductive, anti-static topcoat to the electrically conductive multilayer stack for dissipation. For example, dissipation of p-static charge may be performed primarily by the electrically conductive multilayer stack (e.g., by a metal layer of the electrically conductive multilayer stack). According to embodiments of the present disclosure, p-static charge (or other electric charge) passes through the conductive, anti-static topcoat and the conductive, anti-static tiecoat (and through any intervening layer between the conductive, anti-static topcoat and the electrically conductive multilayer stack) to the metal layer of the electrically conductive multilayer stack (e.g., a gold layer) and the p-static charge (or other electric charge) is dissipated by the metal layer (e.g., the gold layer) to reduce the amount of electric charge (e.g., p-static charge) on a surface of the coated substrate.

The conductive, anti-static tiecoat and the conductive, anti-static topcoat may each independently be formed from a coating composition capable of forming a coating providing p-static charge dissipation and having good weatherability and good resistance to acid rain, chemicals (e.g., solvents), salt-fog, abrasion and rain erosion. According to embodiments of the present disclosure, the conductive, anti-static tiecoat and the conductive, anti-static topcoat can each independently be formed from a coating composition including a hydrophobic first aliphatic polyisocyanate, a second aliphatic polyisocyanate including a hydrophilic portion, a polyester polyol, a fluorinated polyol and a fluorinated alcohol. The coating composition for forming the conductive, anti-static tiecoat further includes reactive salts (e.g., quaternary ammonium salts). The reactive salts included in the conductive, anti-static tiecoat improve the conductivity of the conductive, anti-static tiecoat. The coating composition for forming the conductive, anti-static tiecoat and the coating composition for forming the conductive, anti-static topcoat can each be reacted to form a coating including a polyurethane polymer. Thus, as described herein, the coating can include the various components of the coating composition in their reacted or unreacted forms, for example, the hydrophobic first aliphatic isocyanate and polyester polyol can be included in the coating in their reacted forms (e.g., as monomers in a urethane or carbamate polymer linkage). The hydrophobic components or portions described herein protect embodiments of the coated substrate from UV light and humidity and enhance the chemical resistance of the conductive, anti-static tiecoat to withstand normal hand-washing techniques encountered in the production and flow coating application of the conductive, anti-static topcoat. The hydrophilic components or portions described herein promote static charge dissipation.

A variety of isocyanates and polyisocyanates (such as difunctional, polyfunctional, aromatic, aliphatic, monomeric and oligomeric isocyanates) can be used in the coating composition to form polyurethane coatings. Aliphatic isocyanates have good hydrolytic stability and UV resistance. Non-limiting examples of monomeric aliphatic diisocyanates include hexamethylene diisocyanate, methylene bis-(4-cyclohexylisocyanate), and isophorone diisocyanate. Monomeric aliphatic diisocyanates can be used to prepare polyisocyanate adducts, prepolymers and thermoplastic polyurethanes ("TPUs"). For example, monomeric aliphatic diisocyanates can be used to prepare biuret-based polyisocyanates (e.g., polyisocyanates including the —(HN—CO—)$_2$N-functional group), isocyanurate ring-based polyisocyanates (e.g., isophorone diisocyanate trimers), and other oligomers of polyisocyanates. More specifically, hexamethylene diisocyanate (HDI) can be used to prepare the HDI-based biuret shown in Structure 1 below or the HDI-based trimer including an isocyanurate ring shown in Structure 2 below. Isophorone diisocyanate (IPDI) can be used to prepare the IPDI-based trimer shown in Structure 3 below, which is an isocyanurate ring-based polyisocyanate. HDI trimers including an isocyanurate ring have much lower viscosity than HDI-based biurets. IPDI trimers have lower reactivity than HDI trimers.

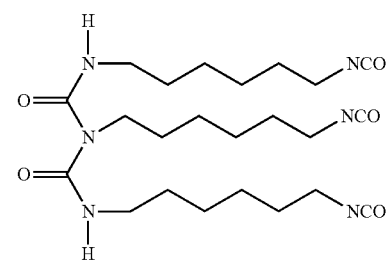

[Structure 1]

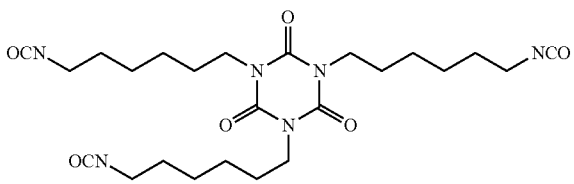

[Structure 2]

[Structure 3]

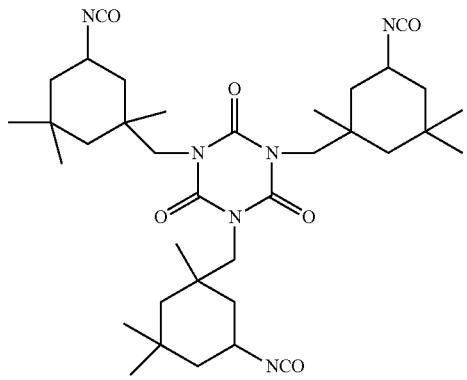

According to embodiments of the present disclosure, the first aliphatic polyisocyanate can be one or more of a biuret-based polyisocyanate, an isocyanurate ring-based polyisocyanate, or an isophorone diisocyanate oligomer. For example, the first aliphatic polyisocyanate can include one or more of the HDI-based biuret shown in Structure 1 above (or a derivative thereof), the HDI-based trimer including an isocyanurate ring shown in Structure 2 above (or a derivative thereof), or the IPDI-based trimer shown in Structure 3 above (or a derivative thereof). Non-limiting commercially available examples of the first aliphatic polyisocyanate (or mixtures including the first aliphatic polyisocyanate) include methylene bis-(4-cyclohexylisocyanate) (e.g., DESMODUR® W), methylene 1,6-hexamethylene diisocyanate-based polyisocyanates (e.g., DESMODUR® N-75, DESMODUR® N-100, DESMODUR® N-3200, DESMODUR® N-3300, DESMODUR® N-3600, and DESMODUR® N-3790) and isophorone diisocyanate-based polyisocyanates (e.g., DESMODUR® Z-4470) (each available from Bayer Material Science). DESMODUR® is a registered trademark of Bayer Material Science, Leverkusen, Germany. Some of the foregoing examples include an aliphatic polyisocyanate dispersed in (or diluted with) a solvent, which reduces the viscosity of the polyisocyanate, thereby improving ease of handling the first aliphatic polyisocyanate.

The first aliphatic isocyanate can have a functionality of 3 or more (e.g., have 3 or more isocyanate functional groups). In some embodiments, the first aliphatic polyisocyanate has an isocyanate functionality in a range of 3.0 to 4.2. For example, the first aliphatic polyisocyanate can have an isocyanate functionality of about 3.2, 3.5, 3.8 or 4.1. In some embodiments, for example, the first aliphatic polyisocyanate can have an isocyanate functionality of about 3.8

According to embodiments of the present disclosure, a coating composition including the first aliphatic polyisocyanate described herein (e.g., an HDI biuret-based polyisocyanate) is capable of forming an elastic coating (or film) having good low temperature flexibility, thereby providing resistance to rain erosion that is not achieved with other polyisocyanates. The coating may also have good weatherability and mechanical strength. Some examples of the coating composition including an HDI biuret-based polyisocyanate formed a coating having good durability, but reduced resistance to rain erosion. Some examples of the coating composition including an isocyanurate ring-based polyisocyanate (e.g., an HDI trimer-based polyisocyanate) formed a coating having good resistance to rain erosion, but reduced chemical (e.g., solvent) resistance. Some examples of the coating composition including an isocyanurate ring-based polyisocyanate formed a coating having a relatively short tack-free time and good chemical resistance, but, due to the high $T_g$ of the isocyanurate ring-based polyisocyanate (~60° C.), the resultant coating was rigid and had poor resistance to rain erosion. In comparison, the $T_g$ of some HDI biuret-based polyisocyanates (e.g., DESMODUR® N-75 and DESMODUR® N-100) is about −60° C.

According to embodiments of the present disclosure, the coating composition further includes a second aliphatic polyisocyanate including a hydrophilic portion. The hydrophilic portion of the second aliphatic polyisocyanate can include a polyether chain. In some embodiments, the second aliphatic polyisocyanate further includes a hydrophobic portion. The hydrophobic portion of the second aliphatic isocyanate can include an isophorone diisocyanate moiety or a derivative thereof. Non-limiting, commercially available examples of the second aliphatic polyisocyanate (or mixtures including the second aliphatic polyisocyanate) include polyether modified HDI trimer-based polyisocyanates (e.g., BAYHYDUR® 302 and BAYHYDUR® 303), polyether modified HDI allophonate-based polyisocyanates (e.g., BAYHYDUR® 304, and/or BAYHYDUR® 305), isophorone diisocyanate-based hydrophilically modified aliphatic polyisocyanate (e.g., polyether modified isophorone diisocyanate trimer, such as BAYHYDUR® 2150BA and/or BAYHYDUR® 401-70), ionic aminosulfonic acid modified HDI polyisocyanates (e.g., BAYHYDUR® XP2547, BAYHYDUR® XP2487/1, and/or BAYHYDUR® XP 2655) (each available from Bayer Material Science). BAYHYDUR® is a registered trademark of Bayer Material Science. The second aliphatic polyisocyanate can have a functionality of 2 or more (e.g., 2 or more isocyanate functional groups).

An example of a polyether modified HDI trimer-based polyisocyanate (non-ionic) is shown as Structure 4 below, which is hydrophilic and readily dispersible in water. Examples of the coating composition including a polyether modified HDI trimer-based polyisocyanate (non-ionic) as the second aliphatic polyisocyanate formed coatings having enhanced anti-static properties, but the coatings exhibited reduced integrity against certain tests such as the humidity test and 50/50-water/IPA test. Accordingly, while these polyisocyanates may be used as the second aliphatic polyisocyanate, other polyisocyanates may provide better coating integrity.

[Structure 4]

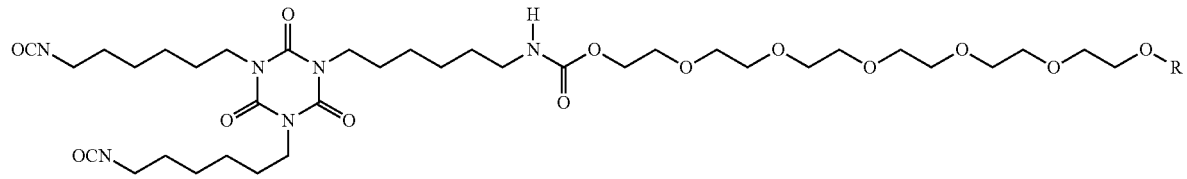

An example of a polyether modified HDI allophonate-based polyisocyanate is shown as Structure 5 below, which is more hydrophobic than the polyether modified HDI trimer-based polyisocyanates (non-ionic) described above, and has higher NCO functionality. Examples of the coating composition including a polyether modified HDI allophonate-based polyisocyanate as the second aliphatic polyisocyanate formed coatings having enhanced film durability and resistance, but the coatings exhibited reduced static charge dissipation, particularly at −40° F. Accordingly, while these polyisocyanates may be used as the second aliphatic polyisocyanate, other polyisocyanates may provide better charge dissipation.

In some embodiments, the second aliphatic polyisocyanate includes a polyether modified IPDI trimer, which includes a polyether chain bonded to an isophorone diisocyanate trimer. An example of a polyether modified IPDI trimer-based polyisocyanate is shown as Structure 7 below. Examples of the coating composition including a polyether modified IPDI trimer-based polyisocyanate as the second aliphatic polyisocyanate unexpectedly formed coatings having good film integrity as well as good static charge dissipation properties. A commercial example of a polyether modified IPDI trimer-based polyisocyanate is BAYHYDUR® 401-70, which has a $T_g$ of about 30° C., forms

[Structure 5]

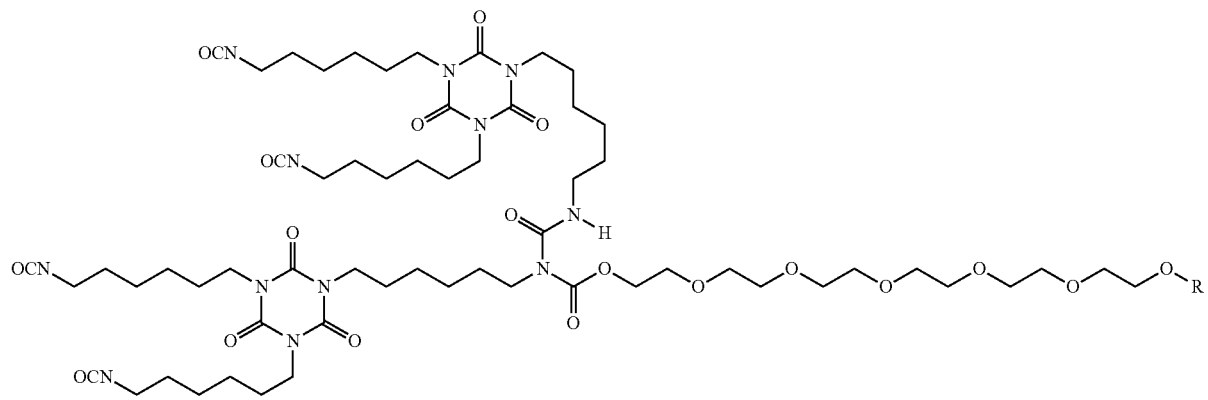

An example of an ionic aminosulfonic acid modified HDI polyisocyanate is shown as Structure 6 below, which has high NCO functionality. Ionic aminosulfonic acid modified HDI polyisocyanates (CAPS) are commercially available from Bayer Material Science as BAYHYDUR® XP2547, BAYHYDUR® XP2487/1, and BAYHYDUR® XP 2655. Examples of the coating composition including an ionic aminosulfonic acid modified HDI polyisocyanate as the second aliphatic polyisocyanate formed coatings having good chemical (e.g., solvent) resistance, but the coatings exhibited minimal improvement in anti-static properties. Accordingly, while these polyisocyanates may be used as the second aliphatic polyisocyanate, other polyisocyanates may provide better anti-static properties.

coatings having an improved time to tack-free (i.e., a shorter time to become tack-free), reduced surface tackiness, and enhanced anti-static properties. However, when excessive amounts of polyether modified IPDI trimer-based polyisocyanate are included in the coating composition as the second aliphatic isocyanate, the coating formed from the coating composition exhibits reduced resistance to rain erosion, increased sensitivity to humidity, and reduced Bayer abrasion resistance. Accordingly, in some embodiments, a weight ratio of the hydrophobic first aliphatic polyisocyanate to the second aliphatic polyisocyanate is in a range of 95:5 to 85:15, such as, for example, a ratio of 95:5, 92:8, 90:10, 87:13 or 85:15.

[Structure 6]

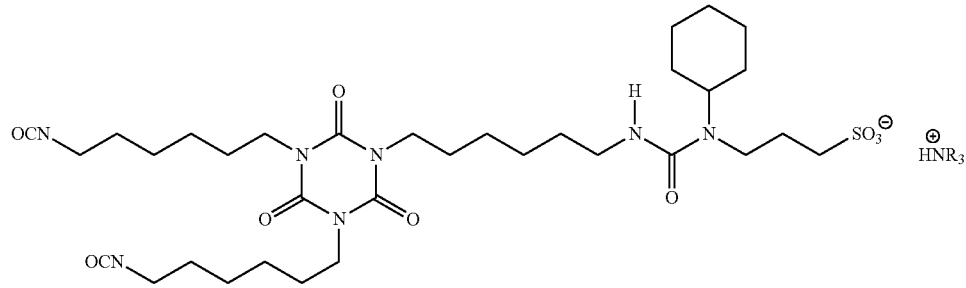

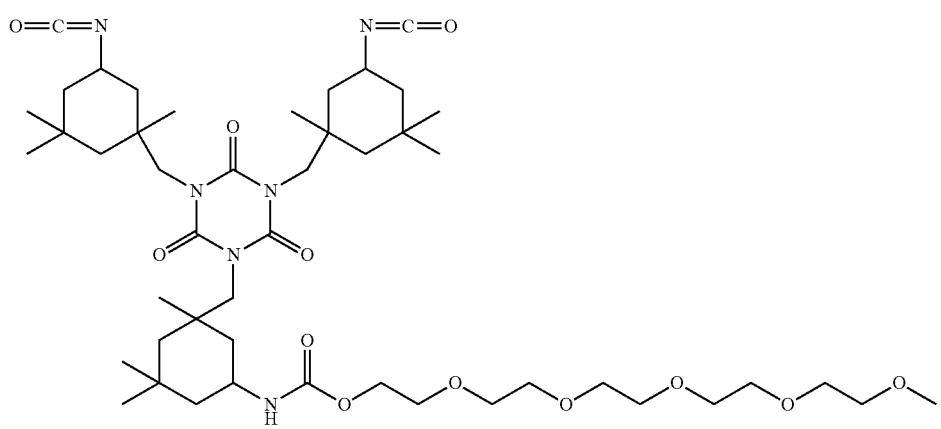

[Structure 7]

In some embodiments, the coating composition further includes a polyester polyol. For example, the polyester polyol can be an aliphatic compound having 2 to 4 hydroxyl groups or a mixture of aliphatic compounds having an average of 2 to 4 hydroxyl groups. The polyester polyol can provide crosslinking and resiliency to a coating formed from the coating composition. Non-limiting examples of the polyester polyol include polycaprolactone polyols and diols. For example, the polyester polyol can be a polycaprolactone polyol, polycaprolactone diol, or mixture thereof having a weight average molecular weight in a range of 300 to 5,000 g/mole, for example, 500 to 1,500 g/mol, and in some embodiments, about 1,000 g/mol.

Polycaprolactone polyols and diols can be prepared using ring-opening polymerization under mild conditions resulting in well-controlled polymerization resulting in no or few byproducts (e.g., water). Polycaprolactone polyols and diols prepared using ring-opening polymerization have low acid values, highly defined functionality, low polydispersity indexes and can be prepared with very high reproducibility. Polycaprolactone polyols and diols can also be prepared with low levels of impurities, are non-toxic and biodegradable, and have high flexibility at low-temperatures, good hydrolytic stability, good tear strength, consistent reactivity and low viscosity (as compared to other polyols). The high flexibility and good tear strength of polycaprolactone polyols and diols can impart resiliency to a coating formed from a coating composition including a polycaprolactone polyol and/or polycaprolactone diol. Coatings having improved resiliency exhibit enhanced Bayer abrasion (described in more detail below) and rain erosion resistance properties. Additionally, the low viscosity of polycaprolactone polyols and diols is beneficial for coating compositions having a high solids content. In some embodiments, the polyester polyol includes a polycaprolactone polyol, a polycaprolactone diol or a mixture thereof.

In some embodiments, the polyester polyol is a polycaprolactone polyol including four hydroxyl groups. For example, the polyester polyol may be a polycaprolactone polyol including four polycaprolactone chains. In some embodiments, each of the polycaprolactone chains includes one of the four hydroxyl groups at a terminal end of the polycaprolactone chain. An example of the polyester polyol (e.g., a polycaprolactone polyol) is shown as Structure 8 below. In the polyester polyol shown as Structure 8, n may be in a range of 1 to 6, such as in a range of 2 to 4. For example, in the polyester polyol shown as Structure 8, n may have an average value of 2. When the polyester polyol is a polycaprolactone polyol including four polycaprolactone chains including one hydroxyl group at a terminal end of each polycaprolactone chain, the coating composition may form a coating having enhanced crosslink density, which in turn improves the resistance of the coating to salt-fog and $SO_2$, chemicals (e.g., solvents), and inorganic acids (e.g., sulfuric acid and nitric acid). Additionally, the resultant coating may still have suitable flexibility due to the presence of the caprolactone units (e.g., 1 to 6 units of caprolactone) in each of the four chains.

[Structure 8]

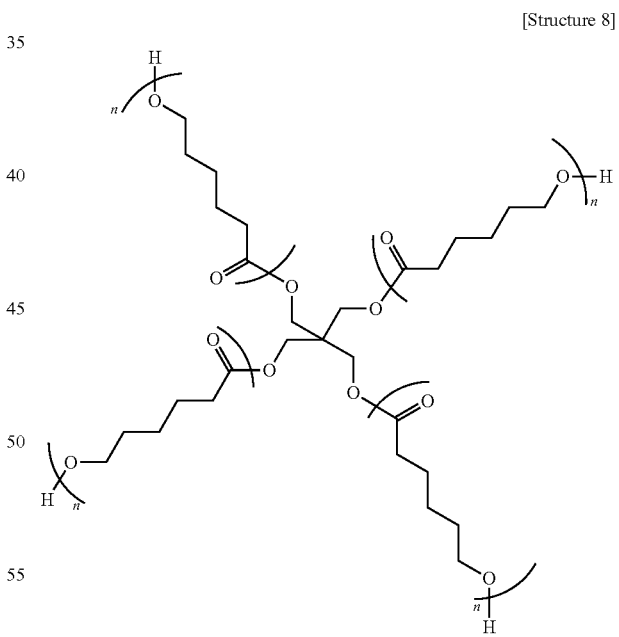

In some embodiments, the polyester polyol is a polyester diol. The polyester diol may be a linear aliphatic diol having a first end including a hydroxyl group and a second end including another primary hydroxyl group. The primary hydroxyl groups may be connected by a polycaprolactone backbone. An example of the polyester polyol (e.g., a polycaprolactone diol) is shown as Structure 9 below. In the polyester diol shown as Structure 9, n may be in a range of 1 to 8, such as in a range of 2 to 6. For example, in the polyester polyol shown as Structure 9, n may have an average value of 4.

When the coating composition includes a polyester polyol, such as a polycaprolactone diol, a coating formed from the coating composition has enhanced resiliency. For example, the relatively long polycaprolactone backbone between the hydroxyl groups may provide the coating with enhanced resiliency. Example embodiments of the coating prepared without the polyester diol, but including another polyester polyol, exhibited resistance to Bayer abrasion (described in more detail below) after 600 strokes of about 3 to 4%, while example embodiments of the coating prepared with the polyester diol exhibited resistance to Bayer abrasion of less than 1% after 600 strokes. Including the polyester diol in the coating composition in excess increases the tackiness of coatings formed from the coating composition and reduces the chemical (e.g., solvent) resistance of the coating. Accordingly, in some embodiments, the polyester polyol and the polyester diol are present in the coating composition at a weight ratio of 95:5 to 50:50, for example at a weight ratio 75:25. Non-limiting, commercially available examples of the polyester polyol and the polyester diol include Capa™ 2101, Capa™ 3031, Capa™ 3041 and Capa™ 4101, each of which are available from Perstop Group, Perstop, Sweden.

According to embodiments of the present disclosure, a coating formed from the coating composition can include the fluorinated alcohol at a surface of the coating. By including the fluorinated alcohol at a surface of the coating, the hydrophobicity and acid resistance of the surface of the coating are increased, thereby increasing the corrosion resistance of the coating. The presence of the fluorinated alcohol at a surface of the coating composition (or the coating) also increases the corrosion resistance of a coated substrate including the coating composition, for example, as a coating. The fluorinated alcohol may be included in the coating composition in an amount in a range of about 0.1 wt % to about 5 wt %, for example, 1 wt %, based on the total weight of the solids content of the coating composition.

In some embodiments, the fluorinated alcohol is a partially fluorinated compound including a hydroxyl group. For example, in certain portions of the compound, most or all of the hydrogen atoms can be replaced with fluorine atoms, while other portions of the compound can include hydrogen bonded to carbon. In other embodiments, the fluorinated alcohol is a perfluorinated compound including a perfluorinated carbon backbone and a hydroxyl group. As would be understood by those of ordinary skill in the art, a "perfluorinated" compound (or chain) is a compound (or chain) in which all hydrogen atoms bonded to carbon atoms are

[Structure 9]

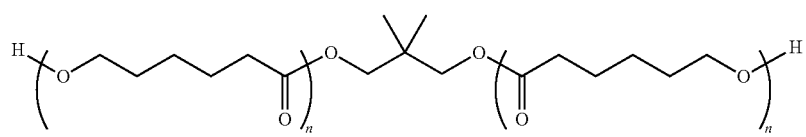

In some embodiments, the coating composition further includes a fluorinated alcohol. For example, the fluorinated alcohol can have one reactive functional group (e.g., a hydroxyl group). By having one reactive group, the fluorinated alcohol can be a migratory fluorinated compound capable of migrating to a surface of the coating composition during formation (e.g., reaction or curing) of the coating. While the extent of the migration of the first fluorinated compound (e.g., the migratory fluorinated compound) is not fully known, based on the acid resistance of the coating formed from the composition and the observed contact angle of water on the coating, it is believed that at least some of the fluorinated alcohol (e.g., the migratory fluorinated compound) migrates to the surface of the coating composition (e.g., the surface of a coating formed from the coating composition).

It is believed that the migration of the fluorinated alcohol to the surface of the coating composition (or the surface of the coating) improves the surface hydrophobicity of the resultant coating and enhances resistance of the coating to acid rain and humidity. In some embodiments, the fluorinated alcohol has a relatively low molecular weight to improve migration of the fluorinated alcohol. For example, the fluorinated alcohol may have a weight average molecular weight in a range of about 300 g/mole to about 400 g/mole, such as a weight average molecular weight of about 364 g/mole. The fluorinated alcohol can include a perfluorinated carbon chain and a hydroxyl group. The fluorinated alcohol can also include a linking group between the perfluorinated carbon chain and the hydroxyl group. Non-limiting examples of the linking group include alkylene groups, such as ethylene, propylene and vinylene groups, and sulfonamide groups.

replaced with fluorine atoms. The fluorinated alcohol can have a carbon backbone having 1 to 20 carbon atoms.

Non-limiting examples of the fluorinated alcohol include perfluorinated or partially fluorinated aliphatic compounds. For example, commercially available perfluorinated aliphatic compounds and/or solutions of perfluorinated aliphatic compounds such as, for example, N-ethyl-N-(2-hydroxyethyl)perfluorooctylsulphonamide (e.g., FLUORAD™ FC-10; available from 3M Company, St. Paul, Minn.); and 3,3,4,4,5,5,6,6,7,7,8,8-tridecafluoro-1-octanol (e.g., CAPSTONE™ 62-AL), and perfluoroalkyl-1-ethanol (e.g., ZONYL® BA) (each available from E.I. du Pont de Nemours and Company, Wilmington, Del.) can be used. ZONYL® is a registered trademark of E.I. du Pont de Nemours and Company. Examples of the fluorinated alcohol include Structures 10 and 11 below:

[Structure 10]

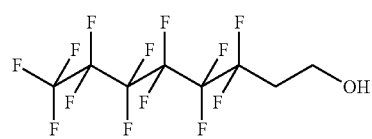

[Structure 11]

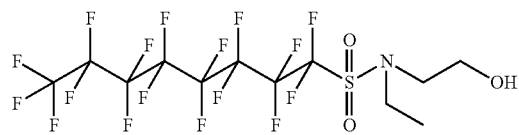

In some embodiments, the coating composition further includes a fluorinated polyol. The fluorinated polyol can be a compound having a carbon backbone with 1 to 20 carbon atoms, and two or more reactive groups, such as hydroxyl groups. That is, the fluorinated polyol can be multifunctional. For example, the fluorinated polyol can be bifunctional, such as a compound having two or more hydroxyl groups. As a result of having two or more reactive functional groups, the fluorinated polyol can react to form a three-dimensional network. In contrast to the fluorinated alcohol, the majority of the fluorinated polyol does not migrate to a surface of the coating composition (or a surface of a coating formed from the composition) and instead is distributed across the thickness of the coating composition or coating (e.g., is distributed throughout the bulk material of the coating composition, or the bulk material of a coating formed from the coating composition). The fluorinated polyol improves the bulk hydrophobicity of a coating formed from the coating composition, thereby improving the acid rain resistance of the coating. Existing coatings (e.g., topcoats), such as FX-446 (available from PPG Industries Inc.), provide some acid rain resistance, but coatings according to embodiments of the present disclosure including the fluorinated polyol (or a reacted fluorinated polyol) in the bulk of the coating provide improved acid rain resistance compared to existing coatings.

Inclusion of the fluorinated polyol causes the coating composition to form a three-dimensional polymer network. Specifically, the two or more reactive functional groups (e.g., hydroxyl groups) of the fluorinated polyol each react with other polymer molecules to form the three-dimensional network structure. The rigidity of the three-dimensional polymer network formed with the fluorinated polyol affects the resiliency of a coating formed from the coating composition. Similarly, other components of the coating composition, such as non-fluorinated polyols (e.g., the aliphatic polyester polyols), can also form part of the three-dimensional network and contribute to the resiliency of a coating formed from the composition. As an example, the rigidity of the three-dimensional network of the composition is influenced, in part, by the number of reactive functional groups (e.g., hydroxyl groups) contained in the fluorinated polyol. Thus, the number of reactive functional groups of the fluorinated polyol will affect the resiliency of a coating formed from the coating composition. Similarly, the number of reactive functional groups (e.g., hydroxyl groups) included in the non-fluorinated polyol (e.g., the polyester polyol) will also affect the resiliency of a coating formed from the coating composition.

In general, greater crosslink density (which is directly related to the number of reactive functional groups (e.g., hydroxyl groups) included in each of the components of the composition) leads to greater rigidity, improved chemical and solvent resistance, and decreased abrasion resistance. The resiliency of a coating formed from the coating composition is also influenced by the molecular weight, and size and type of the backbone of the fluorinated and non-fluorinated compounds in the coating composition. When the composition includes compounds that have more rigid backbone structures, the composition will also be more rigid, while compounds that have relatively more flexible backbone structures will produce a composition that has relatively more resiliency. For a given polyol, increasing the molecular weight of the polyol generally results in a compound that forms coatings having greater resiliency, as compared to the corresponding lower molecular weight polyols.

Accordingly, the desired resiliency of the composition can be achieved by appropriately selecting the number of reactive functional groups (e.g., hydroxyl groups) and molecular weights of the fluorinated compounds or the non-fluorinated compounds. For example, a fluorinated polyol having a fluorinated carbon backbone and two reactive functional groups (e.g., two hydroxyl groups) will form a three-dimensional network that is more flexible than the three-dimensional network formed by a fluorinated polyol having similar chemical composition, the same (or substantially the same) molecular weight, and a fluorinated carbon backbone and three reactive groups (e.g., three hydroxyl groups). Similarly, a fluorinated polyol having three reactive functional groups (e.g., three hydroxyl groups) will form a three-dimensional network that is more flexible than the three-dimensional network formed by a fluorinated polyol having the same (or substantially the same) chemical structure, the same (or substantially the same) molecular weight, a fluorinated carbon backbone, but four reactive groups (e.g., four hydroxyl groups). Increasing the flexibility of the three-dimensional network resulting from use of a fluorinated polyol having two hydroxyl groups increases the resiliency of a coating formed from the coating composition. Thus, in some embodiments, the coating composition (or coating) includes a bifunctional fluorinated polyol (e.g., a compound having two hydroxyl groups), and such coating compositions produce coatings having increased resiliency over coatings produced from coating compositions including trifunctional or tetrafunctional fluorinated polyols (e.g., compounds having three or four hydroxyl groups, respectively). The above-described principles are also applicable to other components of the coating composition, such as the non-fluorinated compounds. For example, desirable resiliency of the coating) can be achieved using an appropriate mixture of non-fluorinated di-functional and tetra-functional polyester polyols in the coating composition.

Non-limiting examples of the fluorinated polyol include fluoropolymers and fluoropolymer precursors, examples of which include, but are not limited to, commercially available pure resins and/or solutions of fluoropolymers and/or fluoropolymer precursors such as LUMIFLON® LF 600X, LUMIFLON® LF 9716, LUMIFLON® LF 9721, LUMIFLON®-910LM and LUMIFLON® LF 916F (available from AGC Chemicals Inc., Exton, Pa.); FLUOROLINK® D10-H, FLUOROLINK® E10-H, FLUOROLINK® D, FOMBLIN® ETX, FOMBLIN® MF-402 and FLUOROBASE Z-1030 (each available Solvay Solexis, Inc.); and POLYFOX® PF-656 and POLYFOX® PF-7002 (available from Omnova Solutions, Fairlawn, Ohio). LUMIFLON® is a registered trademark of Asahi Glass Co., Ltd., FLUOROLINK® is a registered trademark of Solvay Solexis, Inc. FOMBLIN® is a registered trademark of Solvay Fluorati Holding S.P.A., Corporation and POLYFOX® is a registered trademark of Ampac Fine Chemicals LLC.

Of the foregoing examples of the fluorinated polyol, LUMIFLON®-910LM, which is a fluoroethylene vinyl ether, exhibited the best compatibility with the other components of the coating composition. LUMIFLON®-910LM was compatible with the other components of the coating composition throughout a wide range of amounts. The alternating fluoroethylene and vinyl ether segments of LUMIFLON®-910LM provide the resultant coating with good weatherability. For example, the fluoroethylene segments may enhance durability and hydrophobicity of the resultant coating. Accordingly, in some embodiments, the fluorinated polyol includes a backbone including alternating substituted or unsubstituted fluoroethylene and substituted or unsubstituted vinyl ether segments. An example of the fluorinated polyol is shown as Structure 12 below, in which "FE" indicates a repeating fluoroethylene unit and "VE" indicates a repeating vinyl ether unit. In Structure 12, $R_1$ may provide transparency, gloss and hardness; $R_2$ may provide flexibility; $R_3$ may provide crosslinking ability; and $R_4$ may provide adhesion.

[Structure 12]

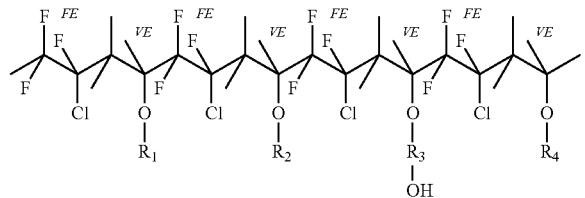

The fluorinated polyol can be included in the coating composition in an amount in a range of about 5 wt % to about 35 wt %, such as in a range of about 15 wt % to about 25 wt %, based on the total weight of the solids in the coating composition. In some embodiments, the fluorinated polyol is present in an amount of about 20 wt % based on the total weight of the solids in the coating composition. At 5 wt % and 10 wt % of the fluorinated polyol, there was some improvement in the acid resistance of the resultant coating. At 15 wt % and 20 wt % of the fluorinated polyol, the resultant coating exhibited substantially enhanced resistance to sulfuric acid and nitric acid (e.g., a 50:50 mixture of sulfuric acid and nitric acid) as compared to existing coatings, such as FX-446. The resultant coating also exhibited improved surface tackiness and steam, humidity and QUV resistance as compared to existing coatings, such as FX-446. Unexpectedly, the fluorinated polyol did not noticeably reduce the anti-static properties of the coating. However, the fluorinated polyol does reduce the Bayer abrasion resistance of the resultant coating. For example, one example of the coating composition including 20 wt % of the fluorinated polyol (based on the total weight of the solids in the coating composition) formed a coating that exhibited a change in haze of 3.5-4.0% after 600 strokes of the Bayer abrasion test (described in more detail below), while an example of the coating composition that did not include the fluorinated polyol exhibited a change in haze of about 1% after 600 strokes of the Bayer abrasion test.

The coating composition described herein can be formed by mixing (or blending) a Part A mixture (e.g., a base component) with a Part B mixture (e.g., a curing component). For example, the Part A mixture and the Part B mixture can be mixed together and cured to form a durable composition (or coating) which is highly weatherable, abrasion resistant, acid resistant and resistant to chemicals or solvents. After mixing the Part A mixture and the Part B mixture, the resultant coating composition can be air dried for a time period in a range of 1.5 to 2 hours and then cured at about 200° F. for a time period of about 5 hours to form a coating. For example, the coating composition (or coating) can form a polyurethane coating having anti-static properties.

The Part A mixture and Part B mixture may be mixed to achieve a ratio of reactive isocyanate groups to reactive hydroxyl groups (e.g., an NCO to OH ratio) in a range of 1.05 to 1.5, such as a ratio of about 1.3. An NCO to OH ratio of about 1.05 resulted in a coating exhibiting good abrasion resistance, but compromised QUV resistance (described in more detail below). An NCO to OH ratio of about 1.3 resulted in a coating exhibiting good abrasion resistance, good QUV resistance, and good resistance to rain erosion. An NCO to OH ratio of about 1.4 resulted in a coating exhibiting good QUV resistance, but lower abrasion resistance and inferior resistance to rain erosion, as compared to the coating formed from the coating composition having an NCO to OH ratio of about 1.3. An NCO to OH ratio of about 1.5 resulted in a coating composition having a short pot life, poor surface flow and poor cosmetics.

The Part A mixture can include a mixture of selective polyols, such as a mixture of hydroxyl containing components having different aliphatic, fluorinated and non-fluorinated backbones having one or more reactive groups, reactive and/or migratory ant-static agents, and reactive and/or migratory UV absorbers/stabilizers. For example, the Part A mixture can include any or all of the polyester polyol (e.g., the first and/or second polyester polyol), the fluorinated polyol, the hydrophilic polyol and the fluorinated alcohol. The Part A mixture can further include additives, such as, for example, a migratory ultraviolet light (UV) absorber, a reactive UV absorber including a hydroxyl group, a migratory UV stabilizer, a reactive UV stabilizer including a hydroxyl group, an antistatic agent (e.g., a conductive compound), an antioxidant, a catalyst, a flow control agent and/or a solvent. However, the Part A mixture need not contain each of these components. The Part A mixture can include additional additives as well.

A migratory UV absorber and/or a reactive UV absorber may be included in the coating composition to absorb UVA and UVB radiation incident to the resultant coating. UV absorbers increase the resistance of the resultant coating to yellowing and/or degradation, and improve long term outdoor durability of the coating. The migratory UV absorber and reactive UV absorber can be based upon any suitable UV absorber. The migratory UV absorber does not include a reactive functional group (e.g., a hydroxyl group) and migrates to a surface of the coating composition (or coating) during the formation (e.g., curing) of the coating composition (or coating). By including the migratory UV absorber, the coating includes a higher concentration of UV absorber at the surface of the composition than a coating not including a migratory UV absorber. Having a higher concentration of UV absorber at the surface of the composition (or coating) improves the lifetime of the coating made from the composition. However, it is desirable to also have UV absorber in the bulk of the composition, as having UV absorbers both at the surface of the composition and in the bulk of the composition will extend the lifetime of a coating made from the composition as compared to a coating made from a composition that only includes UV absorber at the surface.

Additionally, if the compounds migrate to a surface of the composition too quickly, the composition may form haze. For example, UV absorbers that do not include a hydroxyl group (e.g., a reactive hydroxyl group) may migrate to the surface of the coating too quickly resulting in haze. Accordingly, in some embodiments, the coating composition includes the migratory UV absorber only in small amounts (e.g., in a range of about 0.5 wt % to about 0.75 wt % based on the total weight of the solids of the coating composition), if at all. Examples of migratory UV absorbers are shown as Structures 13-17 below.

[Structure 13]

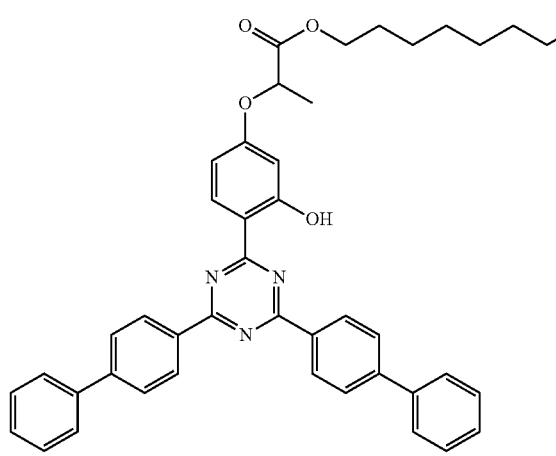

[Structure 14]

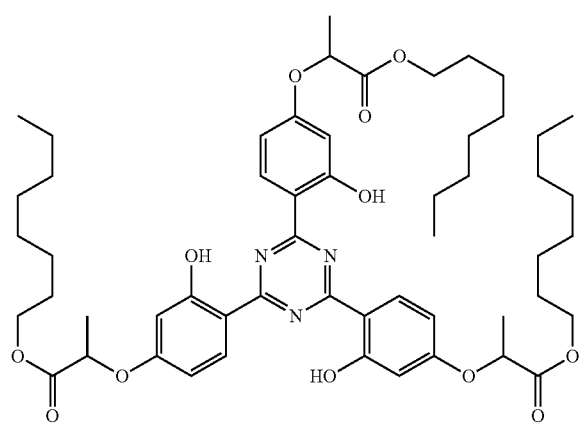

[Structure 15]

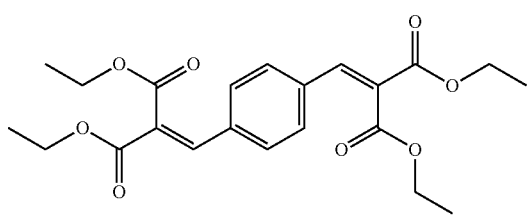

[Structure 16]

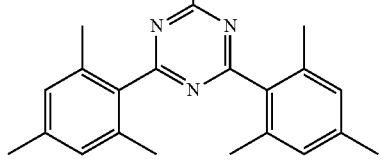

[Structure 17]

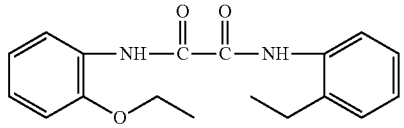

A coating composition according to embodiments of the present disclosure can include a reactive UV absorber as well as, or instead of, the migratory UV absorber. The reactive UV absorber can include one or more reactive functional groups, such as a hydroxyl group. By including the reactive groups, a majority of the reactive UV absorber does not migrate to the surface of the coating composition or the resultant coating and instead is distributed across the thickness of the coating composition or resultant coating (e.g., is distributed throughout the bulk of the coating composition or the resultant coating). Additionally, if the reactive UV absorber is multifunctional, it may contribute to the three-dimensional polymer network formed on reaction of the components of the composition. A non-limiting example of the reactive UV absorber is shown as Structure 18 below, and an example of a commercially available mixture of a migratory UV absorber and a reactive UV absorber is shown as Structure 19 below.

[Structure 18]

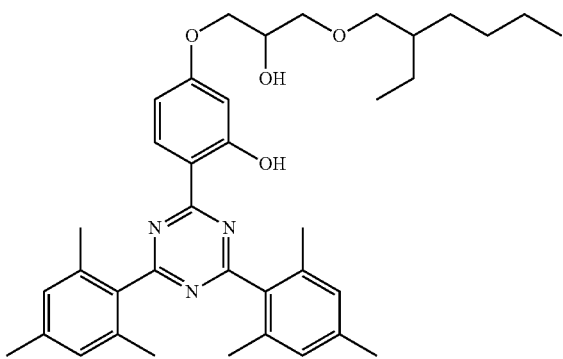

-continued

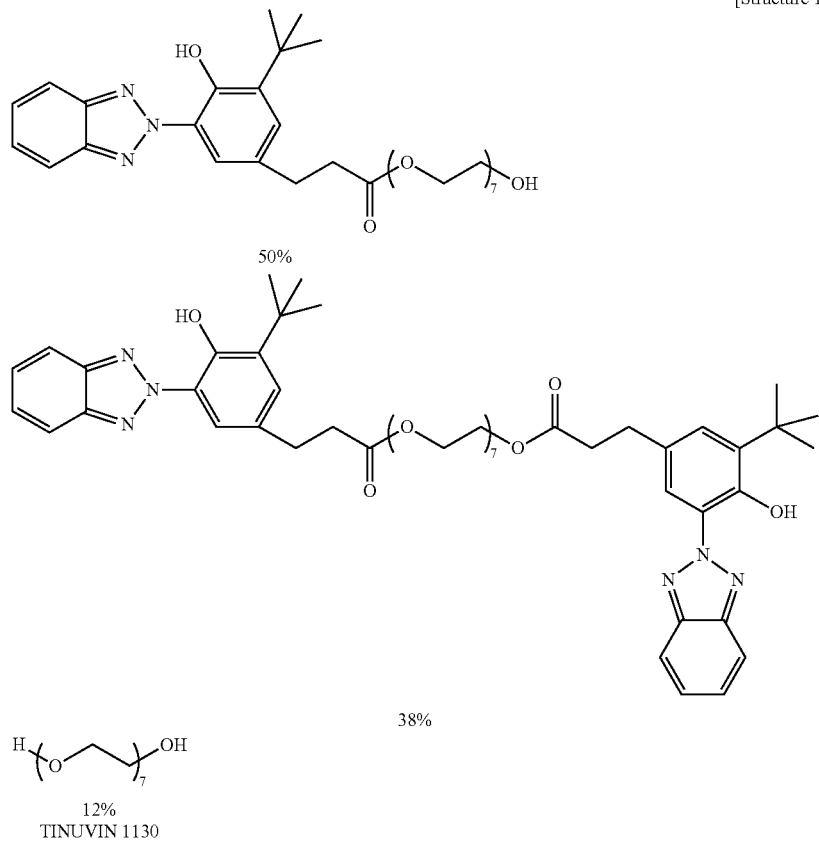

[Structure 19]

Non-limiting commercially available examples of the migratory UV absorber and reactive UV absorber include propanoic acid, 2-[4-[4,6-bis([1,1'-biphenyl]-4-yl)-1,3,5-triazin-2-yl]-3-hydroxyphenoxy]-, isooctyl ester (e.g., TINUVIN® 479), β-[3-(2-H-benzotriazole-2-yl)-4-hydroxy-5-t-butylphenyl]-propionic acid-poly(ethylene glycol) 300 ester, bis {β-[3-(2-H-benzotriazole-2-yl)-4-hydroxy-5-t-butylphenyl]-propionic acid}-poly(ethylene glycol) 300 ester (e.g., TINUVIN® 1130), TINUVIN® 477 and 2-[4-[(2-hydroxy-3-(2'-ethyl)hexyl)oxy]-2-hydroxyphenyl]-4,6-bis(2,4-dimethylphenyl)-1,3,5-triazine (e.g., TINUVIN® 405) (each available from BASF Resins); and p-phenylenebis(methylenemalonic acid)tetraethyl ester (e.g., HOSTAVIN® B-CAP), 2-ethyl, 2'-ehtoxy-oxalanilide (e.g., HOSTAVIN® VSU), and propanedioic acid, 2-[(4-methoxyphenyl)methylene]-, 1,3-dimethylester (e.g., HOSTAVIN® PR-25) (each available from Clariant International Ltd.). TINUVIN® is a registered trademark of Ciba Specialty Chemical Corporation. HOSTAVIN® is a registered trademark of Hoechst GMBH Corporation.

Example coatings formed from coating compositions including the UV absorber according to Structure 18 exhibited no discernible sign of haze formation. It is believed that the presence of the hydroxyl group of the foregoing reactive UV absorbers prevented (or reduced) the migration of the UV absorbers to the surface of the coating by reacting with isocyanate functional groups to form urethane linkages and becoming part of the three-dimensional network, thereby preventing (or reducing) the formation of haze. TINUVIN® 1130 includes both a reactive UV absorber and a migratory UV absorber and, therefore, may cause haze in the coating when used in excess. The migratory UV absorber may be included in the coating composition in a small amount without causing haze in the resultant coating. For example, the migratory UV absorber shown as Structure 13 can be included in the coating composition in an amount in a range of about 0.5 wt % to about 0.75 wt % based on the total weight of the solids of the coating composition without causing noticeable haze in the resultant coating, while also enhancing the QUV resistance of the resultant coating. It is believed that the migratory UV absorber shown as Structure 13 will be present at a higher concentration at the surface of the resultant coating than in the bulk material of the coating, thereby providing additional protection against UV light. Some UV absorbers, such as HOSTAVIN® B-CAP, exhibited poor solubility as a result of poor compatibility with the other components of the coating composition.

The migratory UV stabilizer and reactive UV stabilizer can be based upon any suitable UV stabilizer, such as any suitable free radical scavenger, that has been modified to be reactive or migratory. The migratory UV stabilizer and reactive UV stabilizer reduce degradation of the coating by UV light by scavenging free radicals formed by the dissociation of chemical bonds as a result of UV light absorption. The migratory UV stabilizer does not include a reactive functional group (e.g., a hydroxyl group) and migrates to the surface of the coating during the formation (e.g., curing) of the coating. By including the migratory UV stabilizer, the coating includes a higher concentration of the UV stabilizer at the surface of the coating than does a coating not including a migratory UV stabilizer. Having a higher concentration of UV stabilizer at the surface of the coating improves the lifetime of the coating, and hence improves the lifetime of a coating formed from the coating composition.

However, it is desirable to also have UV stabilizers in the bulk of the coating, as having UV stabilizers both at the surface of the coating and in the bulk of the coating will extend the lifetime of the coating as compared to a coating that only includes UV stabilizers at the surface. Additionally, if the compounds migrate to a surface of the coating too quickly, the coating may develop a haze. Accordingly, a composition according to embodiments of the present disclosure can include the reactive UV stabilizer, the migratory UV stabilizer or both. The reactive UV stabilizer can include one or more reactive functional groups, such as a hydroxyl group. By including the reactive groups, a majority of the reactive UV stabilizer does not migrate to a surface of the coating and instead remains in the interior of the coating (e.g., in the bulk material of the coating) due to reaction of the reactive functional groups with other components of the coating composition. Additionally, if the reactive UV stabilizer is multifunctional, it may contribute to the formation of the three-dimensional network. Non-limiting commercially available examples of the UV stabilizer include propanedioic acid [(4-methoxyphenyl)-methylene]-bis(1,2,2,6,6-pentamethyl-4-piperidinyl)ester (e.g., HOSTAVIN® PR-31 available from Clariant International Ltd.), Sanduvor 3055 (available from Clariant International Ltd.) and commercially available hindered aminoether light stabilizers such as TINUVIN® 123, TINUVIN® 292, TINUVIN® 326, TINUVIN® 328, TINUVIN® 765, TINUVIN® 900, TINUVIN® 900 and TINUVIN® 152 (each available from BASF Resins). TINUVIN® is a registered trademark of Ciba Specialty Chemical Corporation. HOSTAVIN® is a registered trademark Hoechst GMBH Corporation. Examples of reactive UV stabilizers and migratory UV stabilizers are shown as Structures 20-29. Example coatings formed from examples of coating compositions including the UV stabilizer according to Structure 21 exhibited no discernible sign of haze formation.

[Structure 20]

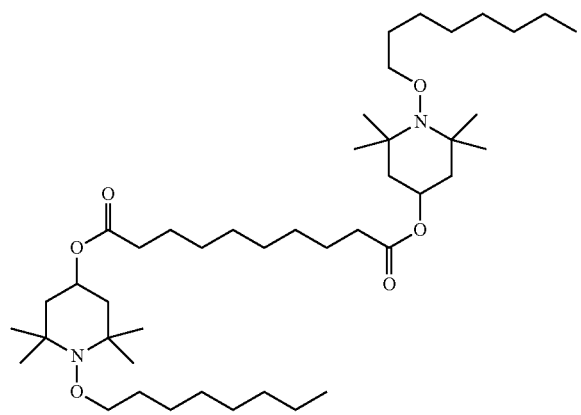

[Structure 21]

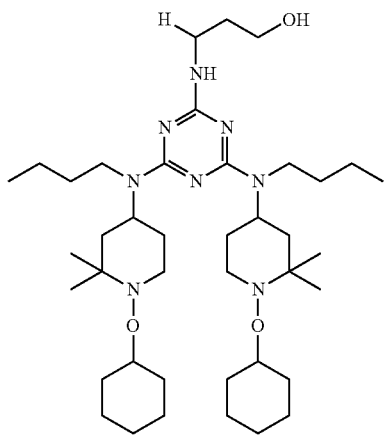

[Structure 22]

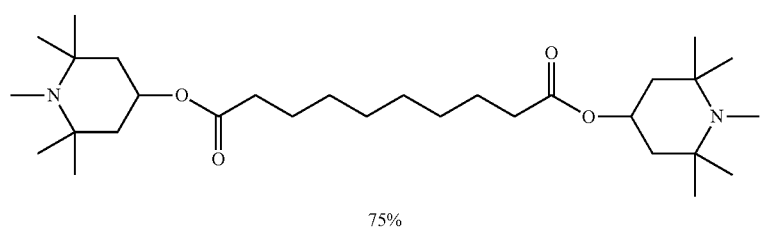

75%

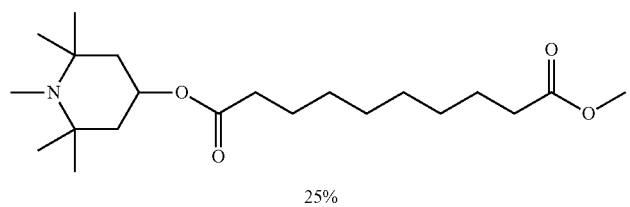

25%

[Structure 23]

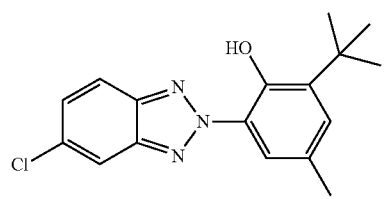

[Structure 24]

[Structure 25]

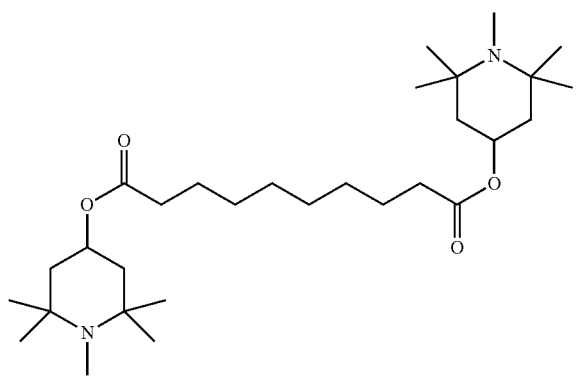

[Structure 26]

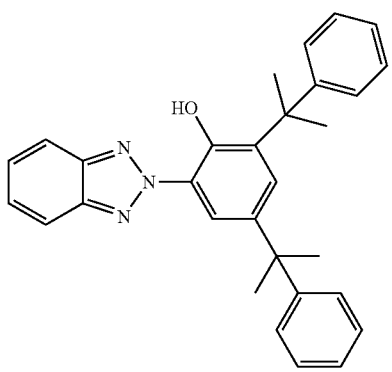

[Structure 27]

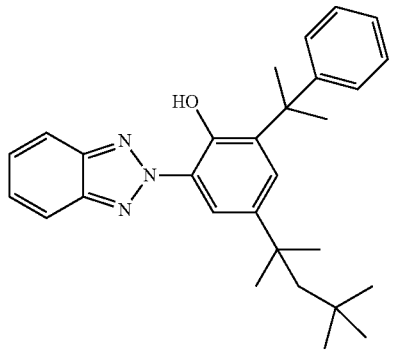

[Structure 28]

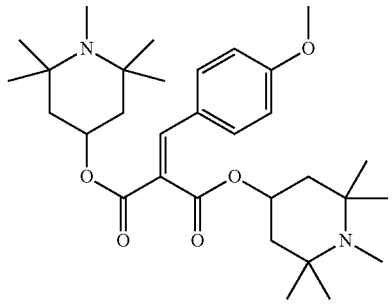

[Structure 29]

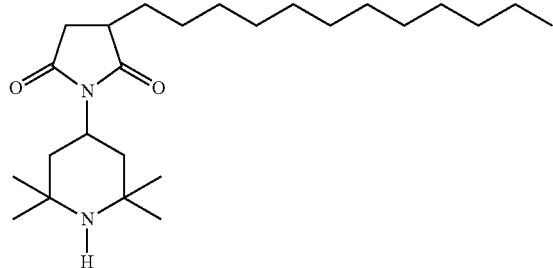

The Part A mixture can include anti-static agents (e.g., conductive compounds, such as conductive metal oxides, quaternary ammonium salts, inherently conductive polymers, and/or other suitable conductive agents), such as those described in U.S. Patent Application Publication No. 2010/0025533 and U.S. Patent Application Publication No. 2010/0028684, the entire contents of which are incorporated herein by reference. Non-limiting commercially available examples of the anti-static agents include Antistat SD100 (available from E.I. du Pont de Nemours and Company), EA Antistat (available from Wells Plastics Ltd), and MAXOMER® AS-1018/75DC (available from PCC Chemax, Inc.). MAXOMER® is a registered trademark of PCC Chemax, Inc.

The anti-static agents (e.g., conductive compounds) can be used to reduce the electrical resistance (e.g., sheet resistance) of the resultant coating to levels acceptable for P-static dissipation, which should be maintained even at low temperatures (e.g., −40° F.). The hydrophilic polyisocyanates discussed above can act as a conductive compound. Alternatively or additionally, a hydrophilic polyol may be included in the coating composition.

For example, the coating described herein can have a sheet resistance such that electric charge (e.g., P-static) can pass through the coating to another layer (e.g., an electrically conductive stack), which can then dissipate or drain the charge. If the resistance of the coating is too high, the amount of electric charge that can pass through the coating is reduced, and the conductive layer will not provide acceptable levels of P-static dissipation. In some embodiments, a primer layer (e.g., a polyacrylate primer) may be included between the coating and the conductive layer (e.g., the electrically conductive multilayer stack). Although the primer layer may have a high sheet resistance (e.g., higher than that of the coating), charge may still pass through the coating and the primer layer to the conductive layer if the primer layer is sufficiently thin. Thus, if a primer layer is included it should be made sufficiently thin to allow enough electric charge to pass through the coating and the primer layer to the conductive layer to provide P-static dissipation.

The general electrical resistance of the coating (the conductive, anti-static tiecoat and the conductive, anti-static topcoat) is more than or equal to $10^{12} \Omega/\square$ to independently dissipate the static charge. The sheet resistance of the coatings described herein varies depending upon the sheet resistance of the material on which the coating is formed. For example, if the coating is on a dielectric layer (e.g., polycarbonate), the sheet resistance of the coating may be about $10^9$ ohms per square, even if a thin primer layer is included between the coating and the dielectric layer. If the coating is on a conductive layer (e.g., a titanium oxide/Au/titanium oxide stack), the sheet resistance of the coating may be $10^7$ ohms per square.

Hydrophilic polyisocyanates, such as those described above, improve conductivity in the coatings. Additionally, as described above, hydrophobic polyisocyanates provide coatings with durability. Thus, as described above, through the combination of hydrophobic and hydrophilic polyisocyanates (e.g., hydrophobic/hydrophilic HDI and IPDI based polyisocyanates), a coating having a good balance of hardness, resiliency, surface tackiness, and conductivity can be obtained.

According to some embodiments, the coating composition may further include a hydrophilic polyol (e.g., a reactive anti-static resin), such as hydrophilic polyol having a functionality of more than 2. The p-static properties of a coating can be significantly improved by introduction of the hydrophilic polyol. The hydrophilic polyol can be any suitable hydrophilic polymer having salt moieties and pendant reactive hydroxyl groups. One non-limiting example of a suitable hydrophilic polyol is Superstat 463, which is commercially available from Advanced Materials & Coating Specialties, Azusa, Calif. The hydrophilic polyol reacts with the polyisocyanates and becomes part of the three dimensional network. A clear coating is then formed with no discernible sign of migration of the hydrophilic polyol to the surface of the coating. It is believed that the conductivity is achieved by moisture absorption in the coating, but the hydrophilic polyol appears to have some inherent conductivity.

A coating having an electrical resistance of $10^5 \Omega/\square$ (on polycarbonate) and good optics is formed when the combined amount of the polyester polyol and the hydrophilic polyol includes 50 wt % of Superstat 463. Such a coating has good performance in p-static tests, even at −40° F. The hydrophilic polyol (e.g., Superstat 463) may be included in the coating composition in an amount in a range of about 5 wt % to about 30 wt % based on the total weight of the solids of the coating composition. When the hydrophilic polyol (e.g., Superstat 463) is included in the coating composition in an amount that is outside of the foregoing range (e.g., is higher than 30 wt %), the resultant coating may have high surface tackiness and may be susceptible to moisture attack when exposed to humidity. The surface tackiness can be reduced by the addition of BYK 3700 (a polydimethylsiloxane resin with pendant hydroxyl groups), incorporation of ethylene glycol or trimethylol propane (TMP), and/or partial replacement of N-75 with IPDI trimer. None of these improvements in surface tackiness yielded a coating having good weatherability, but some of the coatings did exhibit good abrasion resistance.

Useful anti-static coatings were formulated by reducing the hydrophilic polyol (e.g., Superstat 463) content down to a range of 14 wt % to 26 wt %. A typical two-part polyurethane coating has a resistance of more than $10^{12}$ ohms/sq. and is dielectric. By addition of 14 to 24 wt % Superstat 463 (depending upon the other components of the coating composition), the resistance is reduced to between the range of $10^8$ to $10^9$ ohms/sq. on polycarbonate and $10^7$ to $10^8$ ohms/sq. on a conductive layer, such as a stack including titanium oxide/Au/titanium oxide, a stack including AZO/Au/AZO, an ITO layer, a Au layer, an Al layer, and the like. It has repeatedly been demonstrated, by the results of specification tests, that a combination of conductive layer/primer/conductive, anti-static tiecoat/conductive, anti-static topcoat can readily dissipate p-static charge even at temperatures as low as −40° F.

Superstat 463 can enhance the conductivity of the coating. Superstat 463 is compatible with all components of the coating composition and gives a coating having high transparency, low haze, good surface flow, and superior cosmetics. Interestingly, without the presence of Superstat 463, the coating composition may exhibit poor film-forming properties. Therefore, Superstat may be beneficial in enhancing the compatibility among the hydrophilic/hydrophobic components of the coating composition.

The Part A mixture can further include a catalyst, a flow control agent and solvents available in the art. Selection of a suitable catalyst, flow control agent and solvent is within the skill of those of ordinary skill in the art and, therefore, further discussion of those components is not necessary here.

The Part B mixture (e.g., curing component) can include the isocyanate as described above. For example, the Part B mixture (the curing component) can include selective isocyanates, such as an aliphatic hydrophobic polyisocyanate and an aliphatic hydrophilic polyisocyanate. The curing component can further include cure accelerators, cure retardants, plasticizers, additives, and/or fillers. However, like the Part A mixture, the Part B mixture need not contain each of these components. The Part B can include additional additives as well. Selection of suitable cure accelerators, cure retardants, plasticizers, additives, and fillers is within the skill of those of ordinary skill in the art and, therefore, further discussion of those components is not necessary here.

According to embodiments of the present disclosure, the coating composition includes at least one solvent. The solvent(s) may be added to the Part A mixture, the Part B mixture, or both the Part A mixture and the Part B mixture. The solvent(s) reduce the viscosity of the coating composition to make it flow-coatable. The integrity and appearance of the resultant coating can be affected by the nature of the solvents used, even though the solvents are not a permanent component of the cured coating. The evaporation rate of the solvent (or solvent mixture) can be adjusted so that evaporation takes place quickly during the initial drying (e.g., after flow coating) to prevent excessive flow, but slowly enough to give sufficient leveling and adhesion. The solvent(s) used can be non-reactive with isocyanates and non-aggressive against the substrate and/or coated surfaces, so that no (or little) attack takes place during the flow coating and/or airdrying process. The solvent(s) could also influence the rate of isocyanate-hydroxyl reactions, for example during the airdrying period, depending on the extent of hydrogen bonding and dipole moment character of the solvent.

Non-limiting examples of the solvent include isobutyl acetate, 2,6-dimethyl-4-heptanol, butoxy ethyl acetate, isobutyl acetate, 2-butoxyethyl acetate, diisobutyl ketone, dipropyleneglycol dimethyl ether, and propyleneglycol dimethyl ether. In some embodiments, the solvent includes diacetone alcohol (DAA). DAA has a slow evaporation rate and good flow properties. DAA effectively dissolves all (or most) of the components of the coating composition to give a clear, homogeneous solution. DAA has a tertiary hydroxyl group, but the reactivity of the tertiary hydroxyl with isocyanate is much lower than the hydroxyls of the other components of the coating composition, and since DAA begins to evaporate during the airdrying period, the reaction of DAA with the polyisocyanates is negligible.

The solvent may also be used to adjust the solids content of the coating composition. It may be beneficial to maximize the thickness of the resultant coating for improved performance in the rain erosion test. At 70% solids content the coating composition is too viscous for successful flow coating application with existing equipment. At a solids content of 65%, the coating composition forms a coating that is free from cosmetic defects, has good surface quality, and provides good performance in the rain erosion test. A coating composition having a 65% solids content applied to a production F-22 test canopy by a two component mixer (e.g., a mixer, such as the DL 2 mixer, available from Liquid Control Ltd., Wellingborough, England) formed a coating having good surface quality. Offcuts from the test canopy had no apparent damage after 44 minutes of rain erosion testing at 550 mph.

As described above, the coating composition can be used to form the coating. For example, a coated substrate 100 (e.g., a coated transparency) is shown in FIG. 1. As can be seen in the embodiment shown in FIG. 1, the coated substrate 100 (coated transparency) includes the substrate 10, the conductive, anti-static tiecoat 107 on the substrate, and the conductive, anti-static topcoat 105 on the conductive, anti-static tiecoat. In this embodiment, the conductive, anti-static tiecoat 107 and the conductive, anti-static topcoat 105 may each be formed from the coating composition described herein. The coated substrate can be used as a windshield, window, or canopy of an aircraft, but the present disclosure is not limited thereto. For example, the coated substrate can also be used as a window or windshield of a car, aircraft, boat, building, or any other suitable vehicle or structure. In the case of a modern aircraft canopy, the substrate may be an organic resin, such as polycarbonate or polyacrylate.

It is understood that the present disclosure is not limited to the configuration shown in FIG. 1, and there can be one or more additional intervening layers or features between the substrate 10 and the conductive, anti-static topcoat 105. In FIG. 1, the conductive, anti-static topcoat 105 is the outer most layer of the coated substrate, and is a tough, durable and weather resistant material, such as polyurethane, yet is sufficiently pliable and flexible to prevent crack formation due to thermal stress. As described above, the coating composition, and therefore the coating, can include conductive compounds to provide anti-static properties, and the coating can be conductive to help dissipate static charge and other electromagnetic forces. For example, the coating can have antistatic properties to allow static charge to be dissipated to underlying conductive layer(s), if present. In some embodiments, the conductive, anti-static tiecoat and the conductive, anti-static topcoat each independently include other additives such as those described in U.S. Patent Application Publication No. 2010/0025533 and U.S. Patent Application Publication No. 2010/0028684 (e.g., conductive metal oxides, quaternary ammonium salts, inherently conductive polymers, and/or other suitable conductive agents). In some embodiments, the conductive, anti-static tiecoat and/or the conductive, anti-static topcoat is substantially free of inherently conductive polymers, ionic liquids, conductive oxides (e.g., conductive metal oxides), and carbon nanotubes (CNT). As used herein, the terms "substantially free of inherently conductive polymers, ionic liquids, conductive oxides (e.g., conductive metal oxides), and carbon nanotubes (CNT)" and like terms are used as terms of approximation (not as terms of degree) to denote that the amount of inherently conductive polymers, ionic liquids, conductive oxides (e.g., conductive metal oxides), or carbon nanotubes (CNT) in the conductive, anti-static tiecoat and/or the conductive, anti-static topcoat is at most negligible, such that if the inherently conductive polymers, ionic liquids, conductive oxides (e.g., conductive metal oxides), or carbon nanotubes (CNT) are present at all in the conductive, anti-static tiecoat and/or the conductive, anti-static topcoat, it is present as an incidental impurity. In some embodiments, the conductive, anti-static tiecoat and/or the conductive, anti-static topcoat is completely free of inherently conductive polymers, ionic liquids, conductive oxides (e.g., conductive metal oxides), and carbon nanotubes (CNT). For example, under certain conditions, inherently conductive polymers, ionic liquids, conductive oxides (e.g., conductive metal oxides), or CNT are not suitable due to a lack of compatibility with the conductive, anti-static tiecoat and/or the conductive, anti-static topcoat, due to a significant reduction in the light transmission of the conductive, anti-static tiecoat and/or the conductive, anti-static topcoat, and/or due to a resultant intense coloration of the conductive, anti-static tiecoat and/or the conductive, anti-static topcoat The electrically conductive multilayer stack of the coated substrate can include first and second metal oxide layers including titanium oxide, the first metal oxide layer including a first region (e.g., a first sub-layer), a second region (e.g., a second sub-layer) on the first region, and a third region (e.g., a third sub-layer) on the second region, the first region and the third region each having a higher oxygen concentration than that of the second region, and a metal layer (such as a metal layer including gold (Au)) between the first and second metal oxide layers. The first metal oxide layer can be positioned over the transparency, and the metal layer can be positioned between the first metal oxide layer and the second metal oxide layer. As used herein, the term "titanium oxide" refers to any compound containing only Ti and O as the constituent elements. Some non-limiting examples of suitable titanium oxides include $TiO_2$, TiO, $Ti_2O_3$, $Ti_3O$, $Ti_2O$, and derivatives or variations thereof.

Figure 2:
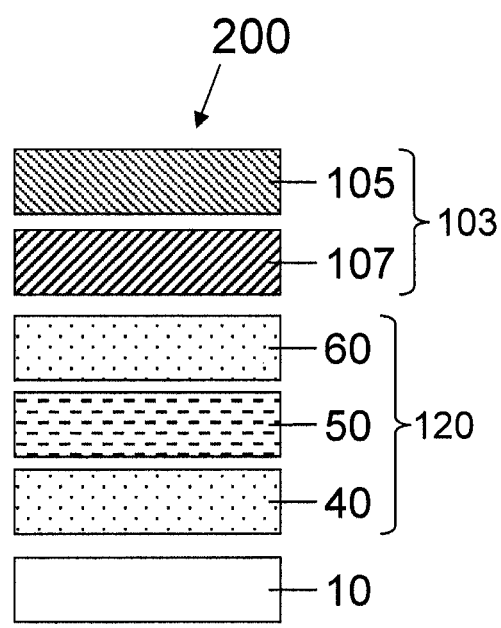
FIG. 2 is an exploded, cross-sectional view of a coated substrate according to an embodiment of the present disclosure.

A coated substrate (e.g., a coated transparency) including such an electrically conductive multilayer stack is shown in FIG. 2. As can be seen in the embodiment of FIG. 2, the coated substrate 200 includes a substrate 10 or transparency (such as an aircraft canopy), and an electrically conductive multilayer stack 120. The electrically conductive multilayer stack includes a first metal oxide layer 40 including titanium oxide adjacent to a metal layer 50, and a second metal oxide layer 60 including titanium oxide adjacent to the metal layer 50. Each of the first and second metal oxide layers and the metal layer can be positioned on or over an adjacent layer in the order shown. One or more of the first metal oxide layer 40 and the second metal oxide layer 60 can include various regions (or sub-layers) as described in more detail below. The coated transparency can also include additional layers, such as tie, base, and topcoat layers, as desired. For example, although the conductive, anti-static topcoat 105 according to embodiments of the present disclosure can be used as a topcoat, in some embodiments, the conductive, anti-static topcoat may be used as a base layer or other coating with one or more additional layers on top of the conductive, anti-static topcoat 105.

Figure 3:
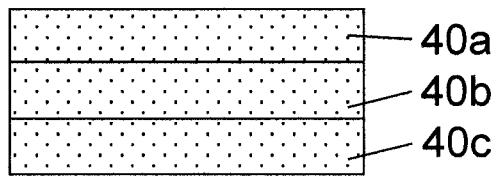
FIG. 3 is an exploded, cross-sectional view of a portion of an electrically conductive multilayer stack according to an embodiment of the present disclosure.

At least one of the first metal oxide layer and the second metal oxide layer includes a first region, a second region on the first region, and a third region on the second region. The first region and the third region each have a higher oxygen concentration than that of the second region. For example, an embodiment in which the first metal oxide layer 40 includes a first region 40a, a second region 40b, and a third region 40c is shown in FIG. 3. As can be seen in the embodiment in FIG. 3, the second region 40b is on the third region 40c, and the first region 40a is on the second region 40b. Alternatively, the second region 40b can be on the first region 40a, and the third region 40c can be on the second region 40b. However, it is understood that the first, second and third regions 40a, b and c can be positioned in any order relative to each other, and are not limited to the positions and order described here and depicted in the drawings.

Figure 4:
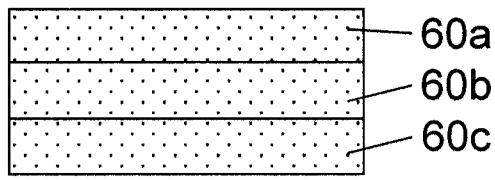
FIG. 4 is an exploded, cross-sectional view of another portion of an electrically conductive multilayer stack according to an embodiment of the present disclosure.
Figure 5:
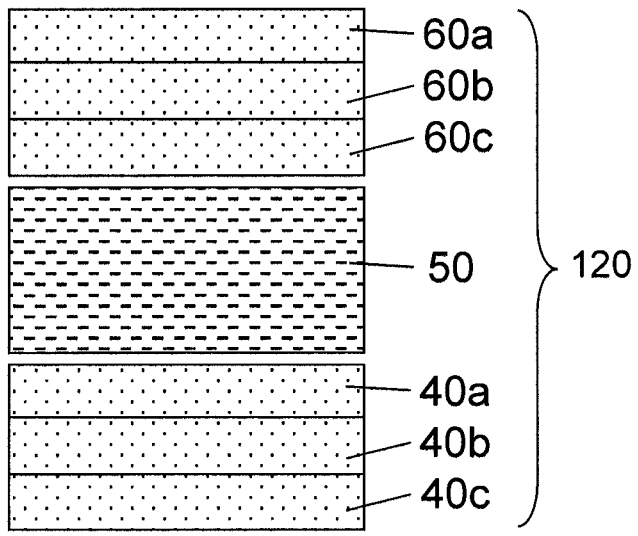
FIG. 5 is an exploded, cross-sectional view of an electrically conductive multilayer stack according to an embodiment of the present disclosure.

FIG. 4 shows another embodiment in which the second metal oxide layer 60 includes a first region 60a, a second region 60b, and a third region 60c. As can be seen in the embodiment in FIG. 4, the second region 60b is on the third region 60c, and the first region 60a is on the second region 60b. Alternatively, the second region 60b can be on the first region 60a, and the third region 60c can be on the second region 60b. FIG. 5 shows another embodiment in which each of the first metal oxide layer 40 and the second metal oxide layer 60 include a first region, a second region, and a third region. The first region and the third region each have a higher oxygen concentration than that of the second region.

According to embodiments of the present disclosure, a method of manufacturing an electrically conductive multilayer stack includes: forming a first metal oxide layer including titanium oxide; forming a metal layer on the first metal oxide layer; and forming a second metal oxide layer including titanium oxide on the metal layer, at least one of the forming the first metal oxide layer and the forming the second metal oxide layer including forming a first region, a second region and a third region, the first region and the third region each having a higher oxygen concentration than the second region. The metal oxide layers can be prepared using any suitable process capable of producing a metal oxide layer including a first region, a second region and a third region, the first region and the third region each having a higher oxygen concentration than the second region. For example, the metal oxide layers can be prepared using physical vapor deposition, atomic layer deposition, and chemical vapor deposition (e.g., plasma enhanced chemical vapor deposition). Additionally, the first region, second region and third region can be formed after the deposition of the corresponding metal oxide layer. For example, the metal oxide layer can be deposited first and then subjected to a post deposition treatment to create the first region, second region and/or third region.

In some embodiments, at least one of the first metal oxide layer or the second metal oxide layer is formed by varying a flow rate of oxygen during formation. The metal oxide layers can be formed by any suitable process, such as, for example, a physical vapor deposition process such as sputtering. The sputtering can include, for example, sputtering from a titanium metal target or $TiO_2$ target, but the present disclosure is not limited thereto. In some embodiments, both of the first metal oxide layer and the second metal oxide layer are formed by varying the flow rate of oxygen during formation (e.g., while sputtering). By varying the flow rate of oxygen during formation, the oxygen concentration of the metal oxide layer can be varied, thereby forming an oxygen concentration gradient in the formed layer. The different oxygen concentrations in the gradient forming the first, second and third regions of the first metal oxide layer or the second metal oxide layer.

For example, varying the flow rate of oxygen while sputtering can include flowing oxygen at a first oxygen flow rate, then flowing oxygen at a second oxygen flow rate, and then flowing oxygen at a third oxygen flow rate. In some embodiments, a ratio of the first oxygen flow rate to the second oxygen flow rate is in a range of about 10:1 to about 25:1, and a ratio of the third oxygen flow rate to the second oxygen flow rate is in a range of about 10:1 to about 25:1. By varying the oxygen flow rate during formation, the first or second metal oxide layer is formed with first, second and third regions, each region having a different oxygen concentration. Additionally, as described in more detail below, varying the oxygen flow rate can also vary the surface roughness of the first region, the second region, and the third region, thereby varying the surface area of each. For example, forming a region of titanium oxide while flowing oxygen at a higher flow rate results in an increased surface area (or surface energy) as compared to forming a region of titanium oxide while flowing oxygen at a lower flow rate. The increased surface area of a region of titanium oxide formed at higher oxygen flow rate can be observed using transmission electron microscopy (TEM), under which the region of titanium oxide will exhibit a wavier cross-section as compared to a region of titanium oxide formed at a lower flow rate of oxygen, which will exhibit a smoother cross-section under TEM.

In some embodiments, varying the flow rate of oxygen during formation (e.g., while sputtering) further includes flowing a first inert gas at a first inert gas flow rate, then flowing a second inert gas at a second inert gas flow rate, and then flowing a third inert gas at a third inert gas flow rate. For example, a ratio of the first oxygen flow rate to the first inert gas flow rate can be in a range of about 0.8:2.2 to about 1:1.8, a ratio of the second oxygen flow rate to the second inert gas flow rate can be in a range of about 1:29 to about 2:25, and a ratio of the third oxygen flow rate to the third inert gas flow rate can be in a range of about 0.8:2.2 to about 1:1.8. By flowing inert gases at the foregoing flow rates, the oxygen concentration of the first region, the second region, or the third region can be further controlled.

In some embodiments, flowing inert gas at the first inert gas flow rate is performed simultaneously with flowing oxygen at the first oxygen flow rate, flowing inert gas at the second inert gas flow rate is performed simultaneously with flowing oxygen at the second oxygen flow rate, and flowing inert gas at the third inert gas flow rate is performed simultaneously with flowing oxygen at the third oxygen flow rate. The first, second and third inert gases can be the same or different. In some embodiments, each of the first inert gas, second inert gas and the third inert gas are all the same (e.g., Ar).

The duration of the deposition process will depend upon the deposition process being used and the characteristics of the electrically conductive multilayer stack, such as the size of the substrate (e.g., the area) on which the electrically conductive multilayer stack is being deposited and the thickness of each of the various layers of the electrically conductive multilayer stack. For example, the duration of the sputtering process will depend upon the size of the target, the power applied to the target, and because the target can move, the number of passes that the target makes over the substrate. The substrate can also move during the deposition process. In consideration of the above-described variables, the deposition process can be carried out for a period of time sufficient to form the first region, the second region, and/or the third region to an appropriate thickness.

For example, the first region can have a thickness in a range of about 0.5 to about 6 nm, such as in a range of about 2 to about 6 nm. Similarly, the third region can have a thickness in a range of about 0.5 to about 6 nm, such as in a range of about 2 to about 6 nm. The second region can have a thickness in a range of about 3 to about 8 nm. Additionally, a ratio of the thickness of the first region to that of the second region can be in a range of about 0.0625:1 to about 1:1, such as in a range of about 0.25:1 to about 1:1. Similarly, a ratio of the thickness of the third region to that of the second region can be in a range of about 0.0625:1 to about 1:1, such as in a range of about 0.25:1 to about 1:1.

As described above, the second region can have a lower oxygen concentration than that of each of the first region and the third region. For example, as set forth above, the second region can be formed by flowing oxygen at a lower flow rate (i.e., lower relative to the oxygen flow rates for either the first region or the third region) during formation. As a result of the second region having a lower oxygen concentration than that of each of the first region and the third region, the second region has improved light transmission properties as compared to the first region and the third region. Consequently, metal oxide layers including first, second and third regions have improved light transmission properties as compared to metal oxide layers that only include a first region and/or a third region.

Additionally, by having a higher oxygen concentration than the second region (e.g., by being formed at a higher oxygen flow rate than that of the second layer), each of the first region and the third region has greater surface roughness than the second region (e.g., the region of lower oxygen concentration). The increased oxygen concentration, and hence increased surface roughness and increased surface area (or surface energy), of the first region and the third region, relative to the second region, improves the adhesion of the metal oxide layer to the substrate or other layers (non-limiting examples of which include metal layers, tie layers, base layers, topcoat layers or the like). For example, metal oxide layers including first and third regions, with higher surface roughness than the second region, have improved adhesion to the substrate as compared to metal oxide layers including only a second region (e.g., a region of relatively lower oxygen concentration). Consequently, the multi-region metal oxide layer described above achieves greater adhesion to at least some of the components of the coated transparency than can be achieved by a metal oxide layer that only includes the second region. Thus, the multi-region metal oxide layer described above has improved adhesion and light transmission properties as compared to metal oxide layers that have only a single region (i.e., a single oxygen concentration) or that do not vary the oxygen concentration as described here.

In some embodiments, the coated substrate (e.g., coated transparency) provides the functionality required of a modern stealth aircraft canopy. For example, in some embodiments, the electrically conductive multilayer stack 120 has a sheet resistance suitable for radar attenuation. More specifically, one or more of the first and second metal oxide layers and the metal layer can be electrically conductive and have a sheet resistance suitable for radar attenuation. When positioned over a transparency or substrate, such as an aircraft canopy, an electrically conductive multilayer stack having a sheet resistance suitable for radar attenuation can prevent or reduce the buildup of static charge on the coated transparency by draining or dissipating the static charge, and it can provide radar attenuation functionality to the coated transparency.

Additionally, some embodiments of the electrically conductive multilayer stack are transparent and, for example, have a visible light transmittance of at least about 61%. In some embodiments, for example, the electrically conductive multilayer stack can have a visible light transmittance in a range of about 61% to about 67%. More specifically, the coating one or more of the first and second metal oxide layers of the electrically conductive multilayer stack can be transparent and/or anti-reflective. Consequently, a coated transparency or substrate, such as an aircraft canopy, including a coating made from the coating composition and the electrically conductive multilayer stack can be transparent and, for example, have a visible light transmittance of at least about 61%. In some embodiments, the visible light transmittance of the coated substrate is above 65% (e.g., in a range of about 65% to about 67%).

In some embodiments, the electrically conductive multilayer stack includes first and second metal oxide layers including titanium oxide, which, according to embodiments of the present disclosure, has a higher refractive index than certain other transparent conductive metal oxides, such as indium tin oxide ITO and AZO. As a result of its higher refractive index, a titanium oxide layer does not need to be made as thick as a corresponding ITO or AZO layer in order to achieve roughly the same anti-reflective properties. By making the metal oxide layer thinner, the flexibility of the metal oxide layer, as measured by strain elongation, can be improved over other coatings including ITO or AZO, as described in more detail below. Although an AZO layer generally has higher flexibility than a titanium oxide layer of the same thickness, the metal oxide layers including titanium oxide of embodiments of the present disclosure can be ultra-thin and therefore, have a higher flexibility than the thicker AZO layers of previous coatings. As such, an electrically conductive multilayer stack including ultra-thin titanium oxide according to embodiments of the present disclosure can be more flexible than previous electrically conductive multilayer stacks including thicker layers of ITO or AZO. For example, the improved flexibility of the ultra-thin metal oxide layers including titanium oxide can improve the overall flexibility of a coating including those layers. Additionally, titanium oxide films, such as those included in embodiments of the present disclosure have good light transmittance in the visible light region (e.g., ~85%), a high refractive index (e.g., ~2.1). Titanium oxide also has better environmental stability (e.g., chemical stability, such as resistance to corrosion induced by water or acid) and mechanical durability than other metal oxides.

Because of the relatively higher refractive index of titanium oxide, a titanium oxide layer can be made thinner than other metal oxide layers such as ITO and AZO and still result in an acceptable amount of destructive interference in the visible light reflected by the first and second metal oxide layers and the metal layer, thereby resulting in an acceptable amount of visible light that is reflected (and consequently an acceptable amount of visible light that is transmitted). Although the anti-reflective properties and visible light transmittance of anti-reflective coatings (such as ITO, AZO and titanium oxide) depend on the relative refractive index of the anti-reflective coating, those properties also depend on the thickness of the anti-reflective coating. Anti-reflective coatings that have a thickness equal to one quarter of the wavelength of visible light (e.g., light having a wavelength of about 400 nm to about 750 nm, or about 550 nm), depending upon the refractive index of the metal oxide, produce destructive interference in the reflected visible light, thereby canceling the reflected visible light and increasing the amount of transmitted visible light. That is, when the thickness of the anti-reflective coating is equal to one quarter of the wavelength of the visible light, the visible light reflected by the anti-reflective coating (i.e., the metal oxide layer) will be out of phase with the visible light reflected by the metal layer, and the visible light reflected from the anti-reflective coating and the metal layer will be canceled as a result of destructive interference. Consequently, the light that would have been reflected by the anti-reflective coating (i.e., the metal oxide layer) and the metal layer is instead transmitted through the anti-reflective coating and the metal layer. Because ITO has to be made ultra-thin to pass the four point bend test, the thicknesses of previous ITO layers were substantially less than one quarter of the wavelength of visible light, thereby limiting the amount of destructive interference produced by those ITO layers and reducing the amount of visible light transmitted. In contrast to the ultra-thin ITO layers, the presently described first and second metal oxide layers, which can include titanium oxide, can be made thinner and still provide acceptable anti-reflective properties. Also, since the titanium oxide layers are made thinner, they are more flexible and can more easily pass the four point bend test. As such, an electrically conductive multilayer stack according to embodiments of the present disclosure provides suitable anti-reflective properties and visible light transmittance.

In some embodiments, the first metal oxide layer has a thickness in a range of about 4 to about 20 nm, such as about 5 to about 15 nm, about 8 to about 15 nm, or about 10 to about 15 nm. Additionally, in some embodiments, the second metal oxide layer has a thickness in a range of about 4 to about 20 nm, such as about 5 to about 15 nm, about 8 to about 15 nm, or about 10 to about 15 nm. An electrically conductive multilayer stack according to embodiments of the present disclosure can include metal oxide layers having the above-described thicknesses and still pass the four point bend test. In contrast, an electrically conductive multilayer stack including an ITO metal oxide layer would typically need to have an ITO layer having a thickness of greater than 20 nm to have suitable anti-reflective properties, and would lack the flexibility necessary to pass the four point bend test. Because an electrically conductive multilayer stack including titanium oxide metal oxide layers of embodiments of the present disclosure are more flexible than, for example, a comparable electrically conductive multilayer stack including ITO metal oxide layers, the electrically conductive stacks of embodiments of the present disclosure are more flexible, and hence more durable (i.e., have superior mechanical properties), than certain previous multilayer stacks.

The present inventors have also discovered that electrically conductive multilayer stacks according to some embodiments of the present disclosure, e.g., electrically conductive multilayer stacks including metal layers including gold, exhibit better corrosion resistance and durability than certain previous coatings. Because gold is less susceptible to corrosion than certain other metals, such as silver, electrically conductive multilayer stacks including gold layers are less susceptible to corrosion than certain previous coatings (e.g., those including silver layers). Consequently, electrically conductive multilayer stacks including gold metal layers are less likely to suffer from degradation of electrical (e.g., sheet resistance) and optical properties (e.g., visible light transmittance), resulting in improved durability of coated transparencies including such multilayer stacks.

In some exemplary embodiments, the electrically conductive multilayer stack includes a first metal oxide layer 40 including titanium oxide, a metal layer 50 including gold, and a second metal oxide layer 60 including titanium oxide. The first metal oxide layer 40 is positioned over a transparency 10, the metal layer 50 is positioned over the first metal oxide layer 40, and the second metal oxide layer 60 is positioned over the metal layer 50. For instance, the metal layer can have a thickness in a range of about 5 to about 20 nm. Additionally, in some embodiments, the metal layer consists essentially of gold. As used herein and in the claims that follow, the term "consisting essentially of gold" and "consisting essentially of" means that the metal layer primarily contains gold, but can contain other substances that do not affect the corrosion resistance, sheet resistance and/or radar attenuation properties of the gold. For instance, a metal layer consisting essentially of gold would be substantially free, or even completely free, of silver (Ag). As used herein, the term "substantially" is used as a term of approximation and not a term of degree, such that the term "substantially free" means that the material being discussed is present in the coating composition (or coating), if at all, as an incidental impurity. As used herein, the term "completely free" means that the material is not present in the coating composition (or coating) at all.

Because gold is less susceptible to corrosion than, for example, silver, a coated transparency including an electrically conductive multilayer stack including a metal layer including gold does not require additional protective organic layers, such as a barrier layer, to protect the metal layer from oxidation. For example, a coated transparency according to some embodiments of the present disclosure includes an electrically conductive multilayer stack including a first metal oxide layer including titanium oxide (e.g., first metal oxide layer 40), a metal layer including gold (e.g., metal layer 50), and a second metal oxide layer including titanium oxide (e.g., second metal oxide layer 60), with the proviso that the coated transparency does not include a barrier layer. As a result, such electrically conductive multilayer stacks can be less complicated and less costly to produce than certain previous stacks (i.e., because it does not require additional protective organic layers, such as a barrier layer, to protect the metal layer from oxidation). By eliminating the barrier layer, the coated transparencies of some embodiments of the present disclosure can be produced in fewer steps and with fewer materials than certain previous transparencies, thereby reducing cost and increasing efficiency of production.

Nonetheless, some embodiments of the coated transparency of the present disclosure can include one or more additional layer(s), such as those set forth below. For example, in some embodiments, the coated transparency further includes an additional topcoat (e.g., a conductive top layer including a conductive metal oxide, a quaternary ammonium salt, an inherently conductive polymer, and/or other suitable conductive agent), a base layer(s) (e.g., a layer including a material selected from polyepoxides, polyacrylates, polyurethanes, polysiloxanes, and combinations thereof), and/or a tie layer(s) (e.g., an acrylic polymer and/or mixture of polymers), such as those described in U.S. Patent Application Publication No. 2010/0025533 and U.S. Patent Application Publication No. 2010/0028684, the entire contents of which are herein incorporated by reference.

Figure 6:
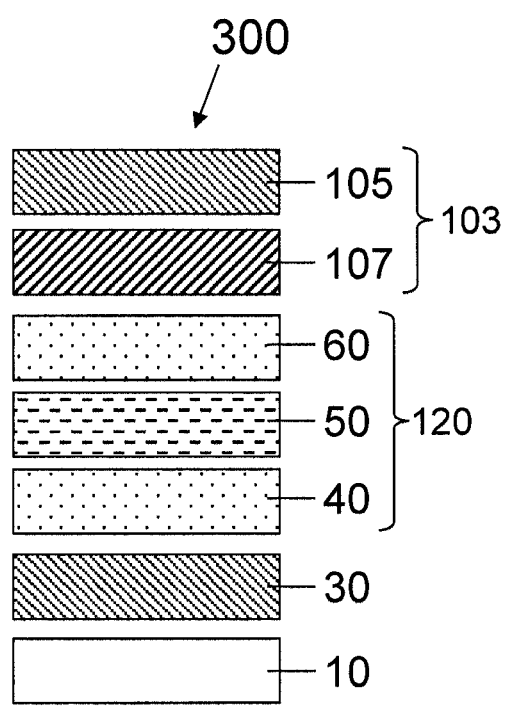
FIG. 6 is an exploded, cross-sectional view of a coated substrate according to another embodiment of the present disclosure.

For example, another embodiment of the present disclosure is shown in FIG. 6. According to this embodiment, a coated substrate 300 includes a substrate 10 (e.g., a transparency), a polymeric base layer 30, an electrically conductive multilayer stack 120, and a coating 103 including a conductive, anti-static tiecoat 107 and a conductive, anti-static topcoat 105 as described herein. Each of the layers of the coated transparency can be positioned on or over an adjacent feature (or layer) in the order shown in FIG. 6. Although not shown, the coated transparency can also include an adhesion promoter (e.g., an adhesion promoter layer), such as 3-aminopropyltriethoxysilane, between the substrate and the subsequent layers. The substrate, the electrically conductive multilayer stack, and the coating (the conductive, anti-static tiecoat and the conductive, anti-static topcoat) are substantially the same as those described above with reference to FIGS. 1 and 2.

The polymeric base layer 30 can be selected to adhere well to the material of the substrate (e.g., polycarbonate and/or polyacrylate). For example, the base layer can cover imperfections of the substrate and promote adhesion of the substrate to another layer, such as the first metal oxide layer 40. That is, the base layer 30 couples the substrate 10 to the electrically conductive multilayer stack 120, and should be capable of bonding thereto. When used in a windshield, window or canopy of an aircraft, the base layer should not adversely affect the impact resistance of the substrate. Additionally, when the based layer directly contacts the first metal oxide layer of the electrically conductive stack, the base layer should be hard enough to support the ceramic metal oxide antireflective coating (e.g., the first metal oxide layer).

In some embodiments of the present disclosure, the base layer 30 includes a material selected from polyepoxides, polyacrylates, polyurethanes, polysiloxanes, and combinations thereof. A polysiloxane base layer can be particularly useful as a result of its inorganic composition and hardness. As such, the base layer 30 can include a polymeric and/or oligomeric silane, among other species. For example, a coating composition can be prepared from a combination of monomeric silanes and silane terminated polymers that are hydrolyzed in a mixture of water and acid to form silanols, which are condensed to a precondensate state after being formed. When the coating composition is applied to a surface and cured, the precondensate, which includes the silanols, reacts to form siloxane linkages, thereby forming an exemplary polysiloxane base layer 30. Alternatively, the base layer 30 can include any suitable polyepoxide, polyacrylate, or polyurethane. For example, the base layer 30 can include a thermally-curable polyacrylate coated with the above-described polysiloxane.

Figure 7:
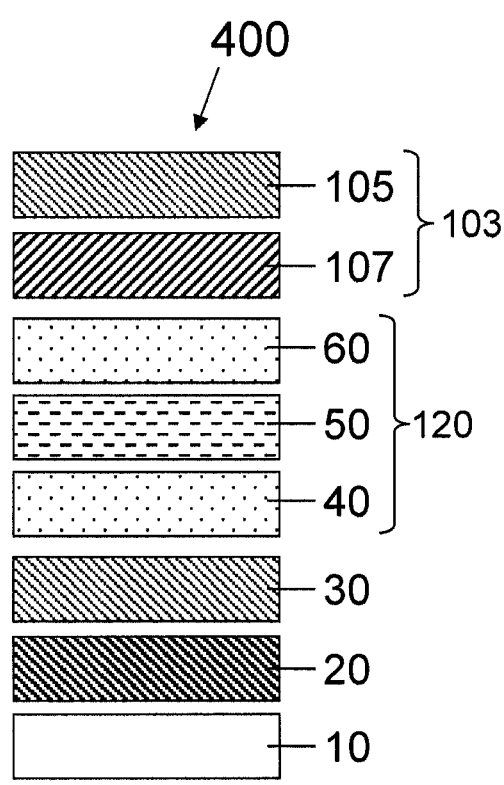
FIG. 7 is an exploded, cross-sectional view of a coated substrate according to another embodiment of the present disclosure.

A soft tiecoat (a tie layer) can also be positioned between the base layer and the substrate. When present, the tie coat dissipates the shrinkage stress that results from the addition of the other layers (e.g., the base layer and the electrically conductive multilayer stack 120), and the tie coat accommodates the dimensional change of the substrate due to extreme thermal exposure. For example, FIG. 7 shows a coated substrate 400 including a substrate 10 (i.e., a transparency), a base layer 30, an electrically conductive multilayer stack 120, and a coating 103 including a conductive, anti-static tiecoat 107 and a conductive, anti-static topcoat 105, as described above. The coated transparency further includes a tie layer 20 between the substrate 10 and the base layer 30.

In the case where the substrate is a polyacrylate, polycarbonate, or similar organic resin, the tie layer 20 can be an acrylic polymer or mixture of polymers, for example an acrylic polymer made of one or more alkyl acrylates and/or methacrylates. Optionally, the tie layer can also include one or more additional adhesion promoters, such as additional monomers. The layer can be applied to the substrate by gravity coating or another suitable application technique. In gravity coating, a polymeric solution of the tie layer polymer(s) or precursor monomers is prepared, and the solution is applied to the canopy in the center and along a longitudinal axis that extends along the entire length of the canopy. The polymeric solution is then discharged from a nozzle and poured over the canopy at the top, allowing the solution to flow down both sides and thereby coat the surface of the canopy. The solution is applied slowly from one end to another along the longitudinal axis of the canopy, until the entire canopy is coated with a tie layer. The coating thickness can be controlled by, for example, controlling the viscosity of the polymeric solution. The liquid coating can be applied by multiple passes to ensure a consistent layer is formed across the canopy. Any excess drips off the canopy are collected at the bottom, through a gutter, where they can be properly disposed of and/or re-used.

In another embodiment, multiple streams of the polymeric solution are directed to impinge on the canopy. The solution streams are ejected through one or more nozzles or other outlets at a constant flow rate. By keeping the flow rate of the polymeric solution constant, the thickness of the coating can be controlled. In addition to the flow rate, the thickness of the coating also depends on the viscosity of the polymeric solution. Increasing the viscosity of the polymeric solution increases the thickness of the coating. In some embodiments, the viscosity of the polymeric solution is in a range of about 2 to about 200 centipoise. Once the canopy is coated with the tie layer material(s), it is air dried under atmospheric conditions and ambient temperatures, and then cured using heat or ultraviolet light.

After the tie layer 20 is applied to the substrate 10 and cured, the base layer 30 is applied by gravity coating or a process similar to that described above. The substrate, including the tie layer 20 and the base layer 30, is then allowed to air dry under ambient conditions, and is then cured.

The first metal oxide layer 40 is applied to the base layer 30 by any suitable process, such as, for example, sputtering. In one exemplary embodiment, the first metal oxide layer is formed using a magnetron sputtering process in which a high voltage plasma discharge causes atoms to be ejected from a target, such as a titanium metal or $TiO_2$ target. The metal or metal oxide then strike the base layer and form a thin, transparent layer of metal oxide. Since the coating is formed on an atomic scale, it is possible to produce uniform layers of films. For titanium oxide, the metal oxide layer 40 can be applied at a relatively moderate temperature, i.e. from about 100° F. to about 200° F. The substrate, including the tie layer 20 and the base layer 30, is heated to a temperature within that range, and a sufficiently thick layer is deposited thereon. Additionally, as described above, forming the first metal oxide layer or the second metal oxide layer can include varying the flow rate of oxygen while sputtering. The target can move during the sputtering process and the target can make multiple passes over the substrate.

In an exemplary embodiment, the titanium oxide film is formed using pulsed DC magnetron sputtering in an argon and $O_2$ gas mixture at a temperature of about 100 to about 200° F.

Once the first metal oxide layer 40 is applied, the metal layer 50 is applied using a physical vapor deposition or sputtering process as described above. For gold, the deposition process can be carried out at a temperature of about 100° F. to about 200° F. After the metal layer 50 is deposited, the second metal oxide layer 60 is then applied, using a process similar to that described above with respect to the first metal oxide layer 40.

After the electrically conductive multilayer stack 120 is formed, the conductive, anti-static tiecoat can be formed thereon. For example, as shown in FIGS. 2, 6 and 7, the conductive, anti-static tiecoat 107 can be formed directly on the second metal oxide layer 60 to provide a conductive, anti-static tiecoat that is in direct physical contact with the second metal oxide layer 60.

Figure 8:
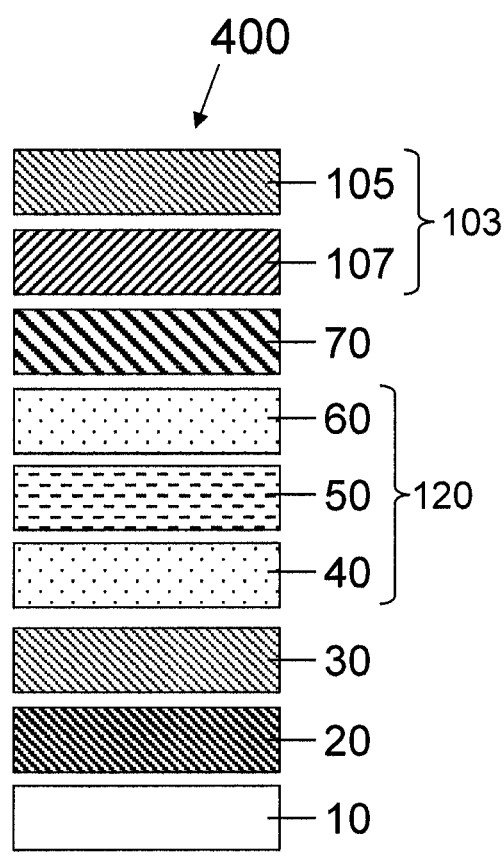
FIG. 8 is an exploded, cross-sectional view of a coated substrate according to another embodiment of the present disclosure.

Alternatively, the coated substrate can include a second tie layer (e.g., a second conductive tie layer) between the electrically conductive stack and the conductive, anti-static tiecoat, as shown in FIG. 8. According to the embodiment shown in FIG. 8, the coated transparency includes a substrate 10 (e.g., a transparency), a tie layer 20, a base layer 30, an electrically conductive multilayer stack 120, a coating 103 including a conductive, anti-static tiecoat 107 and a conductive, anti-static topcoat 105, as described above. The coated transparency further includes a second tie layer 70 (e.g., a topcoat tie layer) between the conductive, anti-static tiecoat 107 and the electrically conductive multilayer stack 120. In one embodiment, the second tie layer 70 includes a polymeric resin that is compatible with the conductive, anti-static tiecoat 107 and optionally includes an organosiloxane compound, which can interact with and bond to the second metal oxide layer 60 of the electrically conductive multilayer stack 120. The conductive, anti-static topcoat 105 can be made of a durable, weather resistant polymer, such as polyurethane. For example, the second tie layer 70 can be a tie layer (e.g., an acrylic polymer and/or mixture of polymers) such as those described in U.S. Patent Application Publication No. 2010/0025533 and U.S. Patent Application Publication No. 2010/0028684.

The following examples are presented for illustrative purposes only and are not to be viewed as limiting the scope of the present disclosure. Unless otherwise indicated, all parts and percentages in the following examples, as well as throughout the specification, are by weight.

Example 1

A polycarbonate canopy for an F-22A jet aircraft was lightly abraded to increase its surface roughness and surface area for receiving a primer (3-aminopropyltriethoxy silane, an adhesion promoter). The primer was gravity coated onto the canopy. Next, a polymeric solution (FX-430, produced by PPG Industries, Inc.,) was applied to the canopy by flow coating to form a tie layer (tiecoat). The polymeric solution was poured from the top of the canopy and from one end to another, allowing the solution to flow down and coat the canopy by gravity flow. Excess polymeric solution was allowed to flow down into a dripping pan and was collected for proper disposal.

After the entire outer surface of the canopy had been coated, it was cured in a heated oven at about 230° F. for about 5 hours. After the coating was cured, the canopy was abraded to increase its surface area for receiving the next coating layer and then cleaned with isopropanol (IPA). A silane basecoat (a silane base layer) was then applied by flow coating, followed by a layer of a base layer (FX-419, produced by PPG Industries, Inc.). The coated canopy was then cured in a preheated oven at a temperature of about 190° F. for about 2 hours. After curing, the canopy was thoroughly cleaned to remove dust particles and particulates that may have accumulated on the surface.

The cleaned canopy was then placed in a vacuum chamber. The pressure in the vacuum chamber was reduced and the substrate in the chamber was heated to about 100 to about 200° F. Two metal oxide layers and one metal layer were deposited on the coated canopy at an elevated temperature (e.g., about 100 to about 200° F.) using magnetron sputtering. First, a layer of titanium oxide was formed by sputtering a TiO$_2$ target using a pulsed DC power supply with 300 kHz frequency. A first region of the titanium oxide was formed by simultaneously flowing oxygen and inert gas at a ratio of about 1:2 while sputtering for a time period of about 5-10 minutes. A second region of the titanium oxide was formed by simultaneously flowing oxygen and inert gas at a ratio of 1:29 while sputtering for a time period of about 5-10 minutes. A third region of the titanium oxide was formed by simultaneously flowing oxygen and inert gas at a ratio of about 1:2 while sputtering for a time period of 5-10 minutes. During sputtering, both the canopy and the target moved.

Then, a gold layer was deposited onto the canopy at the same temperature. After the layer of gold was formed, a second layer of titanium oxide was deposited on top of the gold layer at a temperature of about 100 to about 200° F. in a manner similar to that described above with respect to the first layer of titanium oxide. The canopy was then removed from the chamber and carefully cleaned to remove any contaminants that might have adhered to the surface. A primer layer (acrylate coating with concentration of 1-3%) was formed on the second layer of titanium oxide by flow coating. A conductive, anti-static tiecoat was then applied to the second layer of titanium oxide. Examples of the conductive, anti-static tiecoat were prepared using coating compositions including components in amounts in the ranges shown in Table 1. The amounts in Table 1 are shown in wt %, based on the total weight of the solids of the coating composition. The components listed in Table 1 were also diluted with diacetone alcohol to 65% solids (parts by weight).

TABLE 1

| Component | Amount (wt %) |
|---|---|
| Capa ™ 4101 | 10-25 |
| Capa ™ 2101A | 2-8 |
| Superstat | 15-32 |
| TINUVIN ® T-405 | 1-5 |
| TINUVIN ® T-152 | 0.5-2 |
| LUMIFLON ® 910 LM | 5-15 |
| T-12 | 0.005-0.015 |
| FC-4432 | 0.1-0.6 |
| N-75 | 20-50 |
| BAYHYDUR ® 401-70 | 3-9 |
| Total | 100 |

To further enhance the adhesion of the conductive, anti-static tiecoat to the primer layer and the adhesion of a conductive, anti-static topcoat to the conductive, anti-static tiecoat, 3% (by weight of the total solids) of 3-glycidoxy propyl trimethoxysilane (A-187) coupling agent was added to the coating composition prior to the flow coating application of the conductive, anti-static tiecoat (by two component mixing machine) onto the substrate. The conductive, anti-static tiecoat was airdried for 2 hours and then cured at 190° F. for 5 hours. A conductive, anti-static topcoat was formed on the conductive, anti-static tiecoat by flow coating. Examples of the conductive, anti-static topcoat were prepared using coating compositions including components in amounts in the ranges shown in Table 2. The amounts in Table 2 are shown in wt %, based on the total weight of the solids of the coating composition. The components listed in Table 2 were also diluted with diacetone alcohol to 65% solids (parts by weight).

TABLE 2

| Component | Amount (wt %) |
| --- | --- |
| Capa ™ 4101 | 5-15 |
| Capa ™ 2101A | 2-10 |
| Superstat | 6-25 |
| TINUVIN ® T-405 | 2-10 |
| TINUVIN ® T-152 | 1.0-4 |
| T-479 | 0.1-1 |
| LUMIFLON ® 910 LM | 15-45 |
| Capstone 62 AL | 0.5-2 |
| T-12 | 0.005-0.015 |
| FC-4432 | 0.1-0.6 |
| N-75 | 15-45 |
| BAYHYDUR ® 401-70 | 2-8 |
| Total | 100 |

Haze and Luminous Transmittance Tests

A 3 inch by 12 inch coupon prepared according to Example 1 was tested according to ASTM D1003 using a Haze-Gard Plus instrument. Haze measures the clearness and transparency of the film (the film should not be translucent and diffuse light), while luminous or visible light transmittance indicates the amount of visible light transmitted through the sample. The coupon according to Example 1 exhibited a visible light transmittance of 65.7% and a haze of 1.31%. According to the test results, the coupon according to Example 1 meets the visible light transmittance and haze values required for aircraft canopy, windshield and windows, which are 58% or above and 10% or below, respectively.

Bayer Abrasion Test

The abrasion resistance of a 2 inch by 2 inch coupon prepared according to Example 1 was tested according to ASTM F735 for 300 cycles. Prior to the Bayer abrasion test, the coupon exhibited a visible light transmittance of 68.0% and a haze of 1.60%, as determined by the above-described haze and luminous transmittance test. After 300 cycles of the Bayer Abrasion test, the coupon exhibited a visible light transmittance of 67.5% and haze of 4.5%, as determined by the above-described haze test. According to the test results, the visible light transmittance and haze of the coupon were not significantly altered by the Bayer abrasion test.

Humidity Test

A 3 inch by 12 inch coupon prepared according to Example 1, was exposed to 100% condensing humidity at 122° F. (50° C.). The haze and visible light transmittance (VLT) were then measured after 4 weeks, and then 12 weeks of exposure. Prior to the humidity test, the coupon exhibited a visible light transmittance of 68.10% and a haze of 0.92%. After 4 weeks of exposure to the 100% condensing humidity at 122° F. (50° C.), the coupon exhibited a visible light transmittance of 67.00% and a haze of 1.26%. After 12 weeks of exposure, the coupon exhibited a visible light transmittance of 66.00% and a haze of 1.21%. The crosshatch adhesion (as measured using 10 tape-pulls) of the coupon after both 4 and 12 weeks of exposure was 100% with excellent cosmetics.

Humidity and Solar Radiation (QUV) Test

A 3 inch by 12 inch coupon prepared according to Example 1, was exposed to cycles of 8 hours of ultraviolet (UV) radiation at 140° F. (60° C.) at 0.49 W/m$^2$ followed by exposure to condensation for 4 hours at 122° F. (50° C.). The haze and visible light transmittance (VLT) were then measured after the cycles had been repeated for a total of 4 weeks, and then 12 weeks. Prior to the humidity and solar radiation (QUV) test, the coupon exhibited a visible light transmittance of 65.00% and a haze of 1.68%. After 4 weeks of cycles the coupon exhibited a visible light transmittance of 64.5% and a haze of 2.00%. After 12 weeks of exposure, the coupon exhibited a visible light transmittance of 64.1% and a haze of 2.5%. The crosshatch adhesion (as measured using 10 tape-pulls) of the coupon after both 4 and 12 weeks of exposure was 100% with excellent cosmetics.

Rain Erosion Test

A 1 inch by 1 inch coupon prepared according to Example 1 was exposed to simulated rainfall at a speed of 550 miles per hour (mph) at the University of Dayton Research Institute (UDRI). The coupons were inspected for degradation of the coating after 1 minute, 11 minutes and 22 minutes of exposure to the simulated rainfall. No damage to the coupon or loss of adhesion was observed after 1, 11, and 22 minutes of exposure.

Solvent/Chemical Exposure Test

Several coupons were prepared according to Example 1. A pool having a diameter of 2.5 inches was created on the coating surface of each coupon using tacky tape. The pools respectively included water, a 50/50 (w/w) isopropanol/water mixture, substantially pure isopropanol, a mild soap solution, naphtha, Kilfrost, JP-5 jet fuel, and JP-8 jet fuel. The coupons were continuously exposed to the respective solvents/chemicals for a period of 10 days (and the solvents and/or chemicals were replenished as necessary). After 10 days, the coupons were inspected for fisheye, delamination, or distortion of the surface. The coupons were also tested for crosshatch adhesion in the areas of exposure. No changes to the coupons were observed and the crosshatch adhesion was 100%. Additionally, the light transmittance and haze of the coupons were measured before and after the chemical/solvent exposure test, and no significant change in the light transmittance or haze was observed.

Although various embodiments of the invention have been described, additional modifications and variations will be apparent to those skilled in the art. For example, the coated substrate can have additional tie layers or primers, conductive tie layers, alternate thicknesses, additional components, etc. As used herein, the terms "tie layer" and "base layer" may be considered synonymous with the terms "tiecoat" and "basecoat," respectively. Also, as the individual layers included in the coated substrate are formed, they can be cleaned before the next adjacent layer is deposited. For example, the first tiecoat can be cleaned with a solution such as a mixture of water and alcohols, and then dried to remove any surface water, which could interfere with the flow properties of the polysiloxane of the base layer 30. The invention is not limited to the embodiments specifically disclosed, and the coated transparency, its layers, and compositions may be modified without departing from the invention, which is limited only by the appended claims and equivalents thereof. Throughout the text and claims, the word "about" is used as a term of approximation, not as a term of degree, and reflects the penumbra of variation associated with measurement, significant figures, and interchangeability, all as understood by a person having ordinary skill in the art to which this invention pertains. Additionally, throughout this disclosure and the accompanying claims, it is understood that even those ranges that may not use the term "about" to describe the high and low values are also implicitly modified by that term, unless otherwise specified.

What is claimed is:

1. A coated substrate comprising:
   a substrate;
   an electrically conductive multilayer stack on the substrate; and a coating on the electrically conductive multilayer stack, a thickness of the coating being 5 to 10 mils and the coating comprising:
- a conductive, anti-static tiecoat on the electrically conductive multilayer stack; and
- a conductive, anti-static topcoat on the conductive, anti-static tiecoat, and
- the conductive, anti-static tiecoat being formed from a coating composition comprising a hydrophobic first aliphatic polyisocyanate, a second aliphatic polyisocyanate comprising a hydrophilic portion, a polyester polyol, a hydrophilic polyol, and a fluorinated polyol.

2. The coated substrate of claim 1, wherein a thickness of each of the conductive, anti-static topcoat and the conductive, anti-static tiecoat is 2.5 to 5 mils.

3. The coated substrate of claim 1, wherein the thickness of the coating is 5 to 8 mils.

4. The coated substrate of claim 3, wherein a thickness of each of the conductive, anti-static topcoat and the conductive, anti-static tiecoat is 2.5 to 4 mils.

5. The coated substrate of claim 1, wherein the thickness of the coating is 6 to 8 mils.

6. The coated substrate of claim 5, wherein a thickness of each of the conductive, anti-static topcoat and the conductive, anti-static tiecoat is 3 to 4 mils.

7. The coated substrate of claim 1, wherein a thickness of the conductive, anti-static tiecoat is at least 3 mils.

8. The coated substrate of claim 1, wherein a thickness of the conductive, anti-static topcoat is at least 3 mils.

9. The coated substrate of claim 1, wherein the conductive, anti-static tiecoat is substantially free of inherently conductive polymers, ionic liquids, conductive oxides and carbon nanotubes.

10. The coated substrate of claim 1, wherein the conductive, anti-static topcoat is substantially free of inherently conductive polymers, ionic liquids, conductive oxides and carbon nanotubes.

11. The coated substrate of claim 1, further comprising a tiecoat between the substrate and the electrically conductive multilayer stack.

12. The coated substrate of claim 11, further comprising a basecoat between the tiecoat and the electrically conductive multilayer stack.

13. The coated substrate of claim 1, further comprising a primer layer between the electrically conductive multilayer stack and the conductive, anti-static tiecoat.

14. The coated substrate of claim 1, wherein the coating has a resilience such that the coating can be stretched to a length 50% or more longer than the as-formed length of the coating substantially without tearing the coating.

15. The coated substrate of claim 1, wherein the coating has a resilience such that the coating can be stretched to a length 100% or more longer than the as-formed length of the coating substantially without tearing the coating.

16. The coated substrate of claim 1, wherein the coating has a resilience such that the coating can be stretched to a length 200% or more longer than the as-formed length of the coating substantially without tearing the coating.

17. The coated substrate of claim 1, wherein the second aliphatic polyisocyanate further comprises a hydrophobic portion.

18. The coated substrate of claim 17, wherein the hydrophobic portion of the second aliphatic polyisocyanate comprises an isophorone diisocyanate moiety or a derivative thereof.

19. The coated substrate of claim 1, wherein the hydrophilic portion of the second aliphatic polyisocyanate comprises a polyether chain.

20. The coated substrate of claim 1, wherein the second aliphatic polyisocyanate comprises a polyether chain bonded to an isophorone diisocyanate trimer.

* * * * *